(12) United States Patent
Campbell

(10) Patent No.: US 7,061,004 B2
(45) Date of Patent: Jun. 13, 2006

(54) RESISTANCE VARIABLE MEMORY ELEMENTS AND METHODS OF FORMATION

(75) Inventor: Kristy A. Campbell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/622,482

(22) Filed: Jul. 21, 2003

(65) Prior Publication Data

US 2005/0017233 A1    Jan. 27, 2005

(51) Int. Cl.
*H01L 47/00* (2006.01)
*H01L 29/12* (2006.01)

(52) U.S. Cl. .................. 257/2; 257/4; 365/163
(58) Field of Classification Search .......... 257/2, 257/3, 4, 530, E45.002; 365/163; 438/131, 438/900
See application file for complete search history.

(56) References Cited

U.S. PATENT DOCUMENTS

| | | | |
|---|---|---|---|
| 3,271,591 A | 9/1966 | Ovshinsky | |
| 3,622,319 A | 11/1971 | Sharp | |
| 3,743,847 A | 7/1973 | Boland | |
| 3,961,314 A | 6/1976 | Klose et al. | |
| 3,966,317 A | 6/1976 | Wacks et al. | |
| 3,983,542 A | 9/1976 | Ovshinsky | |
| 3,988,720 A | 10/1976 | Ovshinsky | |
| 4,177,474 A | 12/1979 | Ovshinsky | |
| 4,267,261 A | 5/1981 | Hallman et al. | |
| 4,269,935 A | 5/1981 | Masters et al. | |
| 4,312,938 A | 1/1982 | Drexler et al. | |
| 4,316,946 A | 2/1982 | Masters et al. | |
| 4,320,191 A | 3/1982 | Yoshikawa et al. | |
| 4,405,710 A | 9/1983 | Balasubramanyam et al. | |
| 4,419,421 A | 12/1983 | Wichelhaus et al. | |
| 4,499,557 A | 2/1985 | Holmberg et al. | |
| 4,597,162 A | 7/1986 | Johnson et al. | |
| 4,608,296 A | 8/1986 | Keem et al. | |
| 4,637,895 A | 1/1987 | Ovshinsky et al. | |
| 4,646,266 A | 2/1987 | Ovshinsky et al. | |
| 4,664,939 A | 5/1987 | Ovshinsky | |
| 4,668,968 A | 5/1987 | Ovshinsky et al. | |
| 4,670,763 A | 6/1987 | Ovshinsky et al. | |
| 4,671,618 A | 6/1987 | Wu et al. | |
| 4,673,957 A | 6/1987 | Ovshinsky et al. | |
| 4,678,679 A | 7/1987 | Ovshinsky | |
| 4,696,758 A | 9/1987 | Ovshinsky et al. | |
| 4,698,234 A | 10/1987 | Ovshinsky et al. | |

(Continued)

FOREIGN PATENT DOCUMENTS

JP    56126916    10/1981

(Continued)

OTHER PUBLICATIONS

Abdel-All, A.; Elshafie,A.; Elhawary, M.M., DC electric-field effect in bulk and thin-film Ge5As38Te57 chalcogenide glass, Vacuum 59 (2000) 845-853.

(Continued)

*Primary Examiner*—Kenneth Parker
*Assistant Examiner*—Matthew C Landau
(74) *Attorney, Agent, or Firm*—Dickstein Shapiro Morin & Oshinsky LLP

(57) ABSTRACT

A method and apparatus for providing a resistance variable memory element with improved data retention and switching characteristics have at least one metal-containing layer and a silver layer disposed between glass layers. At least one of the glass layers is a chalcogenide glass, preferably having a $Ge_xSe_{100-x}$ composition.

170 Claims, 10 Drawing Sheets

U.S. PATENT DOCUMENTS

| | | |
|---|---|---|
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolsteinholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B1 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B1 | 1/2003 | Hudgens et al. |
| 6,511,867 B1 | 1/2003 | Lowery et al. |
| 6,512,241 B1 | 1/2003 | Lai |
| 6,514,805 B1 | 2/2003 | Xu et al. |
| 6,531,373 B1 | 3/2003 | Gill et al. |
| 6,534,781 B1 | 3/2003 | Dennison |
| 6,545,287 B1 | 4/2003 | Chiang |
| 6,545,907 B1 | 4/2003 | Lowery et al. |
| 6,555,860 B1 | 4/2003 | Lowery et al. |
| 6,563,164 B1 | 5/2003 | Lowery et al. |
| 6,566,700 B1 | 5/2003 | Xu |
| 6,567,293 B1 | 5/2003 | Lowery et al. |
| 6,569,705 B1 | 5/2003 | Chiang et al. |
| 6,570,784 B1 | 5/2003 | Lowery |
| 6,576,921 B1 | 6/2003 | Lowery |
| 6,586,761 B1 | 7/2003 | Lowery |
| 6,589,714 B1 | 7/2003 | Maimon et al. |
| 6,590,807 B1 | 7/2003 | Lowery |
| 6,593,176 B1 | 7/2003 | Dennison |
| 6,597,009 B1 | 7/2003 | Wicker |
| 6,605,527 B1 | 8/2003 | Dennison et al. |
| 6,613,604 B1 | 9/2003 | Maimon et al. |
| 6,621,095 B1 | 9/2003 | Chiang et al. |
| 6,625,054 B1 | 9/2003 | Lowery et al. |
| 6,642,102 B1 | 11/2003 | Xu |
| 6,646,297 B1 | 11/2003 | Dennison |
| 6,649,928 B1 | 11/2003 | Dennison |
| 6,667,900 B1 | 12/2003 | Lowery et al. |
| 6,671,710 B1 | 12/2003 | Ovshinsky et al. |
| 6,673,648 B1 | 1/2004 | Lowrey |
| 6,673,700 B1 | 1/2004 | Dennison et al. |
| 6,674,115 B1 | 1/2004 | Hudgens et al. |
| 6,687,153 B1 | 2/2004 | Lowery |
| 6,687,427 B1 | 2/2004 | Ramalingam et al. |
| 6,690,026 B1 | 2/2004 | Peterson |
| 6,696,355 B1 | 2/2004 | Dennison |
| 6,707,712 B1 | 3/2004 | Lowery |
| 6,714,954 B1 | 3/2004 | Ovshinsky et al. |
| 6,813,178 B1 * | 11/2004 | Campbell et al. ............ 365/148 |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |

| | | |
|---|---|---|
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki |
| 2002/0168852 A1 | 11/2002 | Harshfield et al. |
| 2002/0190289 A1 | 12/2002 | Harshfield et al. |
| 2002/0190350 A1 | 12/2002 | Kozicki et al. |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1* | 2/2003 | Moore .................. 257/200 |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li |
| 2003/0068862 A1 | 4/2003 | Li |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0209728 A1 | 11/2003 | Kozicki et al |
| 2003/0209971 A1 | 11/2003 | Kozicki et al |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

FOREIGN PATENT DOCUMENTS

| | | |
|---|---|---|
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Adler, D.; Moss, S.C., Amorphous memories and bistable switches, J. Vac. Sci. Technol. 9 (1972) 1182-1189.

Adler, D.; Henisch, H.K.; Mott, S.N., The mechanism of threshold switching in amorphous alloys, Rev. Mod. Phys. 50 (1978) 209-220.

Afifi, M.A.; Labib, H.H.; El-Fazary, M.H.; Fadel, M., Electrical and thermal properties of chalcogenide glass system Se75Ge25-xSbx, Appl. Phys. A 55 (1992) 167-169.

Afifi,M.A.; Labib, H.H.; Fouad, S.S.; El-Shazly, A.A., Electrical & thermal conductivity of the amorphous semiconductor GexSe1-x, Egypt, J. Phys. 17 (1986) 335-342.

Alekperova, Sh.M.; Gadzhieva, G.S., Current-Voltage characteristics of Ag2Se single crystal near the phase transition, Inorganic Materials 23 (1987) 137-139.

Aleksiejunas, A.; Cesnys, A., Switching phenomenon and memory effect in thin-film heterojunction of polycrystalline selenium-silver selenide, Phys. Stat. Sol. (a) 19 (1973) K169-K171.

Angell, C.A., Mobile ions in amorphous solids, Annu. Rev. Phys. Chem. 43 (1992) 693-717.

Aniya, M., Average electronegativity, medium-range-order, and ionic conductivity in superionic glasses, Solid state Ionics 136-137 (2000) 1085-1089.

Asahara, Y.; Izumitani, T., Voltage controlled switching in Cu-As-Se compositions, J. Non-Cryst. Solids 11 (1972) 97-104.

Asokan, S.; Prasad, M.V.N.; Parthasarathy, G.; Gopal, E.S. R., Mechanical and chemical thresholds in IV-VI chalcogenide glasses, Phys. Rev. Lett. 62 (1989) 808-810.

Axon Technologies Corporation, Technology Description: *Programmable Metalization Cell(PMC)*, pp. 1-6 (Pre-May 2000).

Baranovskii, S.D.; Cordes, H., On the conduction mechanism in ionic glasses, J. Chem. Phys. 111 (1999) 7546-7557.

Belin, R.; Taillades, G.; Pradel, A.; Ribes, M., Ion dynamics in superionic chalcogenide glasses: complete conductivity spectra, Solid state Ionics 136-137 (2000) 1025-1029.

Belin, R.; Zerouale, A.; Pradel, A.; Ribes, M., Ion dynamics in the argyrodite compound Ag7GeSe5I: non-Arrhenius behavior and complete conductivity spectra, Solid State Ionics 143 (2001) 445-455.

Benmore, C.J.; Salmon, P.S., Structure of fast ion conducting and semiconducting glassy chalcogenide alloys, Phys. Rev. Lett. 73 (1994) 264-267.

Bernede, J.C., Polarized memory switching in MIS thin films, Thin Solid Films 81 (1981) 155-160.

Bernede, J.C., Switching and silver movements in Ag2Se thin films, Phys. Stat. Sol. (a) 57 (1980) K101-K104.

Bernede, J.C.; Abachi, T., Differential negative resistance in metal/insulator/metal structures with an upper bilayer electrode, Thin solid films 131 (1985) L61-L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165-171.

Berned , J.C.; Khelil, A.; Kettaf, M.; Conan, A., Transition from S- to N-type differential negative resistance in Al-Al2O3-Ag2-xSe1+x thin film structures, Phys. Stat. Sol. (a) 74 (1982) 217-224.

Bondarev, V.N.; Pikhitsa, P.V., A dendrite model of current instability in RbAg4l5, Solid State Ionics 70/71 (1994) 72-76.

Boolchand, P., The maximum in glass transition temperature (Tg) near x=1/3 in GexSe1-x Glasses, Asian Journal of Physics (2000) 9, 709-72.

Boolchand, P.; Bresser, W.J., Mobile silver ions and glass formation in solid electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural ordering of evaporated amorphous chalcogenide alloy films: role of thermal annealing, Diffusion and Defect Data vol. 53-54 (1987) 415-420.

Boolchand, P.; Grothaus, J.; Bresser, W.J.; Suranyi, P., Structural origin of broken chemical order in a GeSe2 glass, Phys. Rev. B 25 (1982) 2975-2978.

Boolchand, P.; Grothaus, J.; Phillips, J.C., Broken chemical order and phase separation in GexSe1-x glasses, Solid state comm. 45 (1983) 183-185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 glasses compared, Proc. Int. Conf. Phys. Semicond. (Eds. Chadi and Harrison) 17th (1985) 833-36.

Bresser, W.; Boolchand, P.; Suranyi, P., Rigidity percolation and molecular clustering in network glasses, Phys. Rev. Lett. 56 (1986) 2493-2496.

Bresser, W.J.; Boolchand, P.; Suranyi, P.; de Neufville, J.P, Intrinsically broken chalcogen chemical order in stoichiometric glasses, Journal de Physique 42 (1981) C4-193-C4-196.

Bresser, W.J.; Boolchand, P.; Suranyi, P.; Hernandez, J.G., Molecular phase separation and cluster size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-Temperature, electric field induced creation of stable devices in CuInSe2 Crystals, Science 258 (1992) 271-274.

Chatterjee, R.; Asokan, S.; Titus, S.S.K., Current-controlled negative-resistance behavior and memory switching in bulk As-Te-Se glasses, J. Phys. D: Appl. Phys. 27 (1994) 2624-2627.

Chen, C.H.; Tai, K.L. , Whisker growth induced by Ag photodoping in glassy GexSe1-x films, Appl. Phys. Lett. 37 (1980) 1075-1077.

Chen, G.; Cheng, J., Role of nitrogen in the crystallization of silicon nitride-doped chalcogenide glasses, J. Am. Ceram. Soc. 82 (1999) 2934-2936.

Chen, G.; Cheng, J.; Chen, W., Effect of Si3N4 on chemical durability of chalcogenide glass, J. Non-Cryst. Solids 220 (1997) 249-253.

Cohen, M.H.; Neale, R.G.; Paskin, A., A model for an amorphous semiconductor memory device, J. Non-Cryst. Solids 8-10 (1972) 885-891.

Croitoru, N.; Lazarescu, M.; Popescu, C.; Telnic, M.; and Vescan, L., Ohmic and non-ohmic conduction in some amorphous semiconductors, J. Non-Cryst. Solids 8-10 (1972) 781-786.

Dalven, R.; Gill, R., Electrical properties of beta-Ag2Te and beta-Ag2Se from 4.2 to 300K, J. Appl. Phys. 38 (1967) 753-756.

Davis, E.A., Semiconductors without form, Search 1 (1970) 152-155.

Dearnaley, G.; Stoneham, A.M.; Morgan, D.V., Electrical phenomena in amorphous oxide films, Rep. Prog. Phys. 33 (1970) 1129-1191.

Dejus, R.J.; Susman, S.; Volin, K.J.; Montague, D.G.; Price, D.L., Structur of Vitreous Ag-Ge-Se, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N.; Klabunde, F., The hydrogenated amorphous silicon/nanodisperse metal (SIMAL) system-Films of unique electronic properties, J. Non-Cryst. Solids 198-200 (1996) 829-832.

El Bouchairi, B.; Bernede, J.C.; Burgaud, P., Properties of Ag2-xSe1+x/n-Si diodes, Thin Solid Films 110 (1983) 107-113.

El Gharras, Z.; Bourahla, A.; Vautier, C., Role of photoinduced defects in amorphous GexSe1-x photoconductivity, J. Non-Cryst. Solids 155 (1993) 171-179.

El Ghrandi, R.; Calas, J.; Galibert, G.; Averous, M., Silver photodissolution in amorphous chalcogenide thin films, Thin Solid Films 218 (1992)259-273.

El Ghrandi, R.; Calas, J.; Galibert, G., Ag dissolution kinetics in amorphous GeSe5.5 thin films from "in-situ" resistance measurements vs time, Phys. Stat. Sol. (a) 123 (1991) 451-460.

El-kady, Y.L., The threshold switching in semiconducting glass Ge21Se17Te62, Indian J. Phys. 70A (1996) 507-516.

Elliott, S.R., A unified mechanism for metal photodissolution in amorphous chalcogenide materials, J. Non-Cryst. Solids 130 (1991) 85-97.

Elliott, S.R., Photodissolution of metals in chalcogenide glasses: A unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vacuum 46 (1995) 701-707.

El-Zahed, H.; El-Korashy, A., Influence of composition on the electrical and optical properties of Ge20BixSe80-x films, Thin Solid Films 376 (2000) 236-240.

Fadel, M., Switching phenomenon in evaporated Se-Ge-As thin films of amorphous chalcogenide glass, Vacuum 44 (1993) 851-855.

Fadel, M.; El-Shair, H.T., Electrical, thermal and optical properties of Se75Ge7Sb18, Vacuum 43 (1992) 253-257.

Feng, X. ;Bresser, W.J.; Boolchand, P., Direct evidence for stiffness threshold in Chalcogenide glasses, Phys. Rev. Lett. 78 (1997) 4422-4425.

Feng, X.; Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143.

Fischer-Colbrie, A.; Bienenstock, A.; Fuoss, P.H.; Marcus, M.A., Structure and bonding in photodiffused amorphous Ag-GeSe2 thin films, Phys. Rev. B 38 (1988) 12388-12403.

Fleury, G.; Hamou, A.; Viger, C.; Vautier, C., Conductivity and crystallization of amorphous selenium, Phys. Stat. Sol. (a) 64 (1981) 311-316.

Fritzsche, H, Optical and electrical energy gaps in amorphous semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep of Ge-Se chalcogenide glasses below Tg: elastic recovery and non-Newtonian flow, J. Non-Cryst. Solids 298 (2002) 260-269.

Guin, J.-P.; Rouxel, T.; Sangleboeuf, J.-C; Melscoet, I.; Lucas, J., Hardness, toughn ss, and scratchability of germanium-selenium chalcogenide glasses, J. Am. Ceram. Soc. 85 (2002) 1545-52.

Gupta, Y.P., On electrical switching and memory effects in amorphous chalcogenides, J. Non-Cryst. Sol. 3 (1970) 148-154.

Haberland, D.R.; Stiegler, H., New Experiments on the charge-controlled switching effect in amorphous semiconductors, J. Non-Cryst. Solids 8-10 (1972) 408-414.

Haifz, M.M.; Ibrahim, M.M.; Dongol, M.; Hammad, F.H., Effect of composition on the structure and electrical properties of As-Se-Cu glasses, J. Apply. Phys. 54 (1983) 1950-1954.

Hajto, J.; Rose, M.J.; Osborne, I.S.; Snell, A.J.; Le Comber, P.G.; Owen, A.E., Quantization effects in metal/a-Si:H/metal devices, Int. J. Electronics 73 (1992) 911-913.

Hajto, J.; Hu. J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si:H-metal thin film structures, J. Non-Cryst. Solids 198-200 (1996) 825-828.

Hajto, J.; Owen, A.E.; Snell, A.J.; Le Comber, P.G.; Rose, M.J., Analogue memory and ballistic electron effects in metal-amorphous silicon structures, Phil. Mag. B 63 (1991) 349-369.

Hayashi, T.; Ono, Y.; Fukaya, M.; Kan, H., Polarized memory switching in amorphous Se film, Japan, J. Appl. Phys. 13 (1974) 1163-1164.

Hegab, N.A.; Fadel, M.; Sedeek, K., Memory switching phenomena in thin films of chalcogenide semiconductors, Vacuum 45 (1994) 459-462.

Helbert et al., *Intralevel hybrid resist process with submicron capability*, SPIE vol. 333 Submicron Lithography, pp. 24-29 (1982).

Hilt, DISSERTATION: *Materials characterization of Silver Chalcogenide Programmable Metalization Cells*, Arizona State University, pp. Title p. 114 (UMI Company, May 1999).

Hirose et al., *High Speed Memory Behavior and Reliability of an Amorphous $As_2S_3$ Film Doped Ag*, Phys. Stat. Sol. (a) 61, pp. 87-90 (1980).

Hirose, Y.; Hirose, H., Polarity-dependent memory switching and behavior of Ag dendrite in Ag-photodoped amorphous As2S3 films, J. Appl. Phys. 47 (1976) 2767-2772.

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Hong, K.S.; Speyer, R.F., Switching behavior in II-IV-V2 amorphous semiconductor systems, J. Non-Cryst. Solids 116 (1990) 191-200.

Hosokawa, S., Atomic and electronic structures of glassy $GexSe1-x$ around the stiffness threshold composition, J. Optoelectronics and Advanced Materials 3 (2001) 199-214.

Hu, J.; Snell, A.J.; Hajto, J.; Owen, A.E., Constant current forming in Cr/p+a-/Si:H/V thin film devices, J. Non-Cryst. Solids 227-230 (1998) 1187-1191.

Hu, J.; Hajto, J.; Snell, A.J.; Owen, A.E.; Rose, M.J., Capacitance anomaly near the metal-non-metal transition in Cr-hydrogenated amorphous Si-V thin-film devices, Phil. Mag. B. 74 (1996) 37-50.

Hu, J.; Snell, A.J.; Hajto, J.; Owen, A.E., Current-induced instability in Cr-p+a-Si:H-V thin film devices, Phil. Mag. B 80 (2000) 29-43.

Huggett et al., Development of silver sensitized germanium selenide photoresist by reactive sputter etching in SF6, 42 Appl. Phys. Lett., No. 7, pp. 592-594 (Apr. 1983).

Iizima, S.; Sugi, M.; Kikuchi, M.; Tanaka, K., Electrical and thermal properties of semiconducting glasses As-Te-Ge, Solid State Comm. 8 (1970) 153-155.

Ishikawa, R.; Kikuchi, M., Photov Itaic study on th photo-enhanced diffusion of Ag in amorphous films of Ge2S3, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non-Cryst. Solids 262 (2000) 135-142.

Jones, G.; Collins, R.A., Switching properties of thin selenium films under pulsed bias, Thin Solid Films 40 (1977) L15-L18.

Joullie, A.M.; Marucchi, J., On the DC electrical conduction of amorphous As2Se7 before switching, Phys. Stat. Sol. (a) 13 (1972) K105-K109.

Joullie, A.M.; Marucchi, J., Electrical properties of the amorphous alloy As2Se5, Mat. Res. Bull. 8 (1973) 433-442.

Kaplan, T.; Adler, D., Electrothermal switching in amorphous semiconductors, J. Non-Cryst. Solids 8-10 (1972) 538-543.

Kawaguchi et al., *Mechanism of photosurface deposition*, 164-166 J. Non-Cryst. Solids, pp. 1231-1234 (1993).

Kawaguchi, T.; Maruno, S.; Elliott, S.R., Optical, electrical, and structural properties of amorphous Ag-Ge-S and Ag-Ge-Se films and comparison of photoinduced and thermally induced phenomena of both systems, J. Appl. Phys. 79 (1996) 9096-9104.

Kawaguchi, T.; Masui, K., Analysis of change in optical transmission spectra resulting from Ag photodoping in chalcogenide film, Japn. J. Appl. Phys. 26 (1987) 15-21.

Kawasaki, M.; Kawamura, J.; Nakamura, Y.; Aniya, M., Ionic conductivity of $Agx(GeSe3)1-x$ ($0<=x<=0.571$) glasses, Solid state Ionics 123 (1999) 259-269.

Kluge, G.; Thomas, A.; Klabes, R.; Grotzschel, R., Silver photodiffusion in amorphous GexSe100-x, J. Non-Cryst. Solids 124 (1990) 186-193.

Kolobov, A.V., On the origin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Kolobov et al., Photodoping of amorphous chalcogenides by metals, Advances in Physics, 1991, vol. 40, No. 5, pp. 625-684.

Korkinova, Ts.N.; Andreichin,R.E., Chalcogenide glass polarization and the type of contacts, J. Non-Cryst. Solids 194 (1996) 256-259.

Kotkata, M.F.; Afif, M.A.; Labib, H.H.; Hegab, N.A.; Abdel-Aziz, M.M., Memory switching in amorphous GeSeTl chalcogenide semiconductor films, Thin Solid Films 240 (1994) 143-146.

Kozicki et al., Silver incorporation in thin films of selenium rich Ge-Se glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes In Metal-Doped Chalcogenides, Electrochemical Society Proceedings, vol. 99-13, 1999, pp. 298-309.

Kozicki et al., Nanoscale effects in devices based on chalcogenide solid solutions, Superlattices and Microstructures, vol. 27, No. 516, 2000, pp. 485-488.

Kozicki et al., Nanoscale phase separation in Ag-Ge-Se glasses, Microelectronic Engineering 63 (2002) pp. 155-159.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of pure & appl. phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in GexSe1-x glass, Appl. Phys. Lett. 46 (1985) 543-545.

Matsushita, T.; Yamagami, T.; Okuda, M., Polarized memory effect observed on Se-SnO2 system, Jap. J. Appl. Phys. 11 (1972) 1657-1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2-V2O5 based glasses, Journal de Physique IV 2 (1992) C2-185—C2-188.

McHardy et al., The dissolution of metals in amorphous chalcogenides and the effects o electron and ultraviolet radiation, 20 J. Phys. C.: Solid State Phys., pp. 4055-4075 (1987)f.

Messoussi, R.; Bernede, J.C.; Benhida, S.; Abachi, T.; Latef, A., Electrical characterization of M/Se structures (M=Ni,Bi), Mat. Chem. And Phys. 28 (1991) 253-258.

Mitkova, M.; Boolchand, P., Microscopic origin of the glass forming tendency in chalcogenides and constraint theory, J. Non-Cryst. Solids 240 (1998) 1-21.

Mitkova, M.; Kozicki, M.N., Silver incorporation in Ge-Se glasses used in programmable metallization cell devices, J. Non-Cryst. Solids 299-302 (2002) 1023-1027.

Mitkova, M.; Wang, Y.; Boolchand, P., Dual chemical role of Ag as an additive in chalcogenide glasses, Phys. Rev. Lett. 83 (1999) 3848-3851.

Miyatani, S.-y., Electronic and ionic conduction in (AgxCu1-x)2Se, J. Phys. Soc. Japan 34 (1973) 423-432.

Miyatani, S.-y., Electrical properties of Ag2Se, J. Phys. Soc. Japan 13 (1958) 317.

Miyatani, S.-y., Ionic conduction in beta-Ag2Te and beta-Ag2Se, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157-6161.

Nang, T.T.; Okuda, M.; Matsushita, T.; Yokota, S.; Suzuki, A., Electrical and optical parameters of GexSe1-x amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky S.R.; Fritzsche, H., Reversible structural transformations in amorphous semiconductors for memory and logic, Mettalurgical transactions 2 (1971) 641-645.

Ovshinsky, S.R., Reversible electrical switching phenomena in disordered structures, Phys. Rev. Lett. 21 (1968) 1450-1453.

Owen, A.E.; LeComber, P.G.; Sarrabayrouse, G.; Spear, W.E., New amorphous-silicon electrically programmable nonvolatile switching device, IEE Proc. 129 (1982) 51-54.

Owen, A.E.; Firth, A.P.; Ewen, P.J.S., Photo-induced structural and physico-chemical changes in amorphous chalcogenide semiconductors, Phil. Mag. B 52 (1985) 347-362.

Owen, A.E.; Le Comber, P.G.; Hajto, J.; Rose, M.J.; Snell, A.J., Switching in amorphous devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pearson, A.D.; Miller, C.E., Filamentary conduction in semiconducting glass diodes. App. Phys. Lett. 14 (1969) 280-282.

Pinto, R.; Ramanathan, K.V., Electric field induced m mory switching in thin films f the chalcogenide system Ge-As-Se, Appl. Phys. Lett. 19 (1971) 221-223.

Popescu, C., The effect of local non-uniformities on thermal switching and high field behavior of structures with chalcogenide glasses, Solid-state electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.KH.; Shemetova, V.K., Memory and threshold switching effects in amorphous selenium, Phys. Stat. Sol. (a) 44 (1977) K71-K73.

Prakash, S.; Asokan, S.; Ghare, D.B., Easily reversible memory switching in Ge-As-Te glasses, J. Phys. D: Appl. Phys. 29 (1996) 2004-2008.

Rahman, S.; Sivarama Sastry, G., Electronic switching in Ge-Bi-Se-Te glasses, Mat. Sci. and Eng. B12 (1992) 219-222.

Ramesh, K.; Asokan, S.; Sangunni, K.S.; Gopal, E.S.R., Electrical Switching in germanium telluride glasses doped with Cu and Ag, Appl. Phys. A 69 (1999) 421-425.

Rose,M.J.;Hajto,J.;Lecomber,P.G.;Gage,S.M.;Choi,W.K. ;Snell,A.J.;Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A. G.;Owen,A.E., Aspects of non-volatility in a -Si:H memory devices, Mat. Res. Soc. Symp. Proc. V 258, 1992, 1075-1080.

Schuocker, D.; Rieder, G., On the reliability of amorphous chalcogenide switching devices, J. Non-Cryst. Solids 29 (1978) 397-407.

Sharma, A.K.; Singh, B., Electrical conductivity measurements of evaporated selenium films in vacuum, Proc. Indian Natn. Sci. Acad. 46, A, (1980) 362-368.

Sharma, P., Structural, electrical and optical properties of silver selenide films, Ind. J. Of pure and applied phys. 35 (1997) 424-427.

Shimizu et al., *The Photo-Erasable Memory Switching Effect of Ag Photo-Doped Chalcogenide Glasses*, 46 B. Chem. Soc. Japan, No. 12, pp. 3662-3385 (1973).

Snell, A.J.; Lecomber, P.G.; Hajto, J.; Rose, M.J.; Owen, A.E.; Osborne, I.L., Analogue memory effects in metal/a-Si:H/metal memory devices, J. Non-Cryst. Solids 137-138 (1991) 1257-1262.

Snell, A.J.; Hajto, J.;Rose, M.J.; Osborne, L.S.; Holmes, A.; Owen, A.E.; Gibson, R.A.G., Analogue memory effects in metal/a-Si:H/metal thin film structures, Mat. Res. Soc. Symp. Proc. V 297, 1993, 1017-1021.

Steventon, A.G., Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B 4 (1990) 1373-1377.

Tanaka, K.; Lizima, S.; Sugi, M.; Okada, Y.; Kikuchi, M., Thermal effects on switching phenomenon in chalcogenide amorphous semiconductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D., White, R.M., Electric field enhanced phase separation and memory switching in amorphous arsenic triselenide, Journal(??) (1972) 4609-4612.

Tichy, L.; Ticha, H., Remark on the glass-forming ability in GexSe1-x and AsxSe1-x systems, J. Non-Cryst. Solids 261 (2000) 277-281.

Titus, S.S.K.; Chatterj e, R.; Asokan, S., Electrical switching and short-range rder in As-T glasses, Phys. Rev. B 48 (1993) 14650-14652.

Tranchant,S.;Peytavin,S.;Ribes,M.;Flank,A.M.;Dexpert,H.;Lagarde,J.P., Silver chalcogenide glasses Ag-Ge-Se: Ionic conduction and exafs structural investigation, Transport-structure relations in fast ion and mixed conductors Proceedings of the 6th Riso International symposium. Sep. 9-13, 1985.

Tregouet, Y.; Bernede, J.C., Silver movements in Ag2Te thin films: switching and memory effects, Thin Solid Films 57 (1979) 49-54.

Uemura, O.; Kameda, Y.; Kokai, S.; Satow, T., Thermally induced crystallization of amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric field induced filament formation in As-Te-Ge glass, J. Non-Cryst. Solids 2 (1970) 358-370.

Viger, C.; Lefrancois, G.; Fleury, G., Anomalous behaviour of amorphous selenium films, J. Non-Cryst. Solids 33 (1976) 267-272.

Vodenicharov, C.; Parvanov,S.; Petkov,P., Electrode-limited currents in the thin-film M-GeSe-M system, Mat. Chem. And Phys. 21 (1989) 447-454.

Wang, S.-J.; Misium, G.R.; Camp, J.C.; Chen, K.-L.; Tigelaar, H.L., High-performance Metal/silicide antifuse, IEEE electron dev. Lett. 13 (1992)471-472.

Weirauch, D.F., Threshold switching and thermal filaments in amorphous semiconductors, App. Phys. Lett. 16 (1970) 72-73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971-2974.

West, W.C., Electrically erasable non-volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non-Cryst. Solids 151 (1992) 149-154.

* cited by examiner

RESISTANCE VARIABLE MEMORY ELEMENTS AND METHODS OF FORMATION

FIELD OF THE INVENTION

The invention relates to the field of random access memory (RAM) devices formed using a resistance variable material, and in particular to a resistance variable memory element formed using chalcogenide glass.

BACKGROUND OF THE INVENTION

A well known semiconductor component is semiconductor memory, such as a random access memory (RAM). RAM permits repeated read and write operations on memory elements. Typically, RAM devices are volatile, in that stored data is lost once the power source is disconnected or removed. Non-limiting examples of RAM devices include dynamic random access memory (DRAM), synchronized dynamic random access memory (SDRAM) and static random access memory (SRAM). In addition, DRAMS and SDRAMS also typically store data in capacitors which require periodic refreshing to maintain the stored data.

In recent years, the number and density of memory elements in memory devices have been increasing. Accordingly, the size of each element has been shrinking, which in the case of DRAMs also shortens the element's data holding time. Typically, a DRAM memory device relies on element capacity for data storage and receives a refresh command in a conventional standardized cycle, about every 100 milliseconds. However, with increasing element number and density, it is becoming more and more difficult to refresh all memory elements at least once within a refresh period. In addition, refresh operations consume power.

Resistance variable memory elements, which includes programmable conductor memory elements, have been investigated for suitability as semi-volatile and non-volatile random access memory elements. Kozicki et al. in U.S. Pat. Nos. 5,761,115; 5,896,312; 5,914,893; and 6,084,796, disclose a programmable conductor memory element including an insulating dielectric material formed of a chalcogenide glass disposed between two electrodes. A conductive material, such as silver, is incorporated into the dielectric material. The resistance of the dielectric material can be changed between high resistance and low resistance states. The programmable conductor memory is normally in a high resistance state when at rest. A write operation to a low resistance state is performed by applying a voltage potential across the two electrodes. The mechanism by which the resistance of the element is changed is not fully understood. In one theory suggested by Kozicki et al., the conductively-doped dielectric material undergoes a structural change at a certain applied voltage with the growth of a conductive dendrite or filament between the electrodes effectively interconnecting the two electrodes and setting the memory element in a low resistance state. The dendrite is thought to grow through the resistance variable material in a path of least resistance.

The low resistance state will remain intact for days or weeks after the voltage potentials are removed. Such material can be returned to its high resistance state by applying a reverse voltage potential between the electrodes of at least the same order of magnitude as used to write the element to the low resistance state. Again, the highly resistive state is maintained once the voltage potential is removed. This way, such a device can function, for example, as a resistance variable memory element having two resistance states, which can define two logic states.

One preferred resistance variable material comprises a chalcogenide glass. A specific example is germanium-selenide ($Ge_xSe_{100-x}$) comprising silver (Ag). One method of providing silver to the germanium-selenide composition is to initially form a germanium-selenide glass and then deposit a thin layer of silver upon the glass, for example by sputtering, physical vapor deposition, or other known techniques in the art. The layer of silver can be irradiated, preferably with electromagnetic energy at a wavelength less than 600 nanometers, so that the energy passes through the silver and to the silver/glass interface, to break a chalcogenide bond of the chalcogenide material such that the glass is doped or photodoped with silver. Silver may also be provided to the glass by processing the glass with silver, as in the case of a silver-germanium-selenide glass. Another method for providing metal to the glass is to provide a layer of silver-selenide on a germanium-selenide glass.

In accordance with the current methods of incorporating silver into the glass, the degree and nature of the crystallinity of the chalcogenide material of the memory element has a direct bearing upon its programming characteristics. Accordingly, current processes for incorporating silver require the precise control of the amounts of $Ge_xSe_{100-x}$ glass and silver, so as not to incorrectly dope the glass and improperly alter the crystallinity of the chalcogenide material. Current processes also require careful selection of the exact stoichiometry of the glass to ensure that silver is incorporated into the glass while the glass backbone remains in the glass forming region.

Furthermore, during semiconductor processing and/or packaging of a fabricated original structure that incorporates the memory element, the element undergoes thermal cycling or heat processing. Heat processing can result in substantial amounts of silver migrating into the memory element uncontrollably. Excessive silver incorporated into the memory element may result in faster degradation, i.e., a short life, and eventually, device failure.

U.S. application Ser. No. 10/120,521, the entire disclosure of which is incorporated herein by reference, describes a resistance variable memory element and a method of forming the resistance variable memory element. The resistance variable memory element includes a metal-containing layer formed between a first chalcogenide glass layer and a second glass layer. The resistance variable memory element provides improved memory retention and switching characteristics.

There remains a need, however, for a resistance variable memory element that is faster, is more temperature resilient, and has better cycling endurance.

BRIEF SUMMARY OF THE INVENTION

In a first embodiment, the invention provides a resistance variable memory element and a method of forming the resistance variable memory element. The resistance variable memory element includes a metal-containing layer and a silver layer formed between a first chalcogenide glass layer and a second glass layer. One or both of the glass layers may be doped with a metal, and one or more metal-containing layers may be provided between the glass layers.

In a narrower aspect of the first embodiment, the invention provides a memory element and a method of forming the memory element in which at least one layer of silver-selenide and a layer of silver are formed between a first chalcogenide glass layer and a second glass layer. The second glass layer may also be a chalcogenide glass layer. The stack of layers comprising a first chalcogenide glass, a silver-selenide layer, a silver layer, and a second glass layer are formed between two conductive layers or electrodes.

In a variation of the first embodiment of the invention, a stack of layers may contain more than one metal-containing layer, and a silver layer, between a chalcogenide glass layer and a second glass layer. In another variation of the first embodiment, a first chalcogenide glass layer may contain multiple chalcogenide glass layers, and a second glass layer may contain multiple glass layers. Thus the stack of layers may contain one or more metal-containing layers in serial contact with each other, and a silver layer, formed between a multi-layered chalcogenide glass layer and a multi-layered second glass layer. In yet another variation of the first embodiment, one or more of each of the first chalcogenide glass layers and the second glass layers may contain a metal dopant, such as, for example, a silver dopant.

According to a second embodiment, the invention provides a memory element and a method of forming a memory element comprising a plurality of alternating layers of chalcogenide glass layers, metal-containing layers, and silver layers, whereby the layers start with a first chalcogenide glass layer and end with a last chalcogenide glass layer, with the first chalcogenide glass layer contacting a first electrode and the last chalcogenide glass layer contacting a second electrode. Thus, the plurality of alternating layers of chalcogenide glass layers, metal-containing layers, and silver layers are stacked between two electrodes. The metal-containing layers preferably comprise a silver-chalcogenide, such as silver-selenide. In a variation of the second embodiment, the metal-containing layers may each contain a plurality of metal-containing layers. In another variation of the second embodiment, the chalcogenide glass layers may each contain a plurality of chalcogenide glass layers. In yet another variation of this embodiment, one or more of the chalcogenide glass layers may contain a metal dopant, such as, for example, a silver dopant.

BRIEF DESCRIPTION OF THE DRAWINGS

These and other features and advantages of the invention will be better understood from the following detailed description, which is provided in connection with the accompanying drawings.

DETAILED DESCRIPTION OF THE INVENTION

Figure 1:
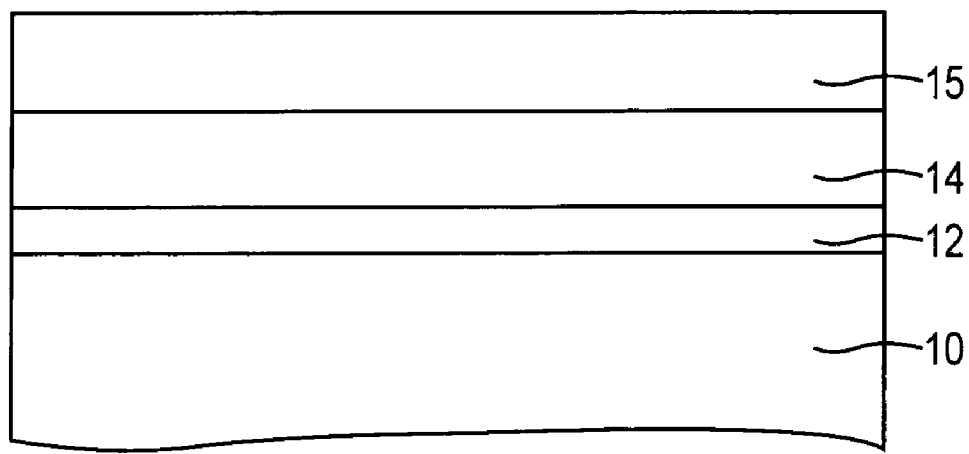
FIG. 1 is a cross-sectional view of a memory element fabricated in accordance with a first embodiment of the invention and at an initial stage of processing.

In the following detailed description, reference is made to various specific embodiments of the invention. These embodiments are described with sufficient detail to enable those skilled in the art to practice the invention. It is to be understood that other embodiments may be employed, and that various structural, logical, and electrical changes may be made without departing from the spirit or scope of the invention.

The term "substrate" as used in the following description may include any supporting structure including but not limited to a semiconductor substrate that has an exposed substrate surface. A semiconductor substrate should be understood to include silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation.

The term "silver" is intended to include not only elemental silver, but silver with other trace metals or in various alloyed combinations with other metals as is known in the semiconductor industry, as long as such silver alloy is conductive, and as long as the physical and electrical properties of the silver remain unchanged.

The term "silver-selenide" is intended to include various species of silver-selenide, including some species which have a slight excess or deficit of silver, for instance, $Ag_2Se$, $Ag_{2+x}Se$, and $Ag_{2-x}Se$.

The term "semi-volatile memory" is intended to include any memory device or element which is capable of maintaining its memory state after power is removed from the device for a prolonged period of time. Thus, semi-volatile memory devices are capable of retaining stored data after the power source is disconnected or removed. Accordingly, the term "semi-volatile memory" is also intended to include not only semi-volatile memory devices, but also non-volatile memory devices.

The term "resistance variable material" is intended to include chalcogenide glasses, and chalcogenide glasses comprising a metal, such as silver. For instance, the term "resistance variable material" includes silver doped chalcogenide glasses, silver-germanium-selenide glasses, and chalcogenide glass comprising a silver selenide layer.

The term "resistance variable memory element" is intended to include any memory element, including programmable conductor memory elements, semi-volatile memory elements, and non-volatile memory elements which exhibit a resistance change in response to an applied voltage.

The term "chalcogenide glass" is intended to include glasses that comprise an element from Group VIA (also known as Group 16) of the Periodic Table. Group VIA elements, also referred to as chalcogens, include oxygen (O), sulfur (S), selenium (Se), tellurium (Te), and polonium (Po).

As indicated above, U.S. application Ser. No. 10/120,521 describes a resistance variable memory element that includes a metal-containing layer formed between a first chalcogenide glass layer and a second glass layer. In the present invention, an additional layer, a layer of evaporated silver, is located adjacent to the metal-containing layer. As a result, the resistance variable memory element has fewer surface defects than a structure having only a metal-containing layer formed between a first chalcogenide glass layer and a second glass layer. In addition, by employing a method in which the layer of silver is evaporated, one can add the correct amount of silver directly to the metal-containing layer rather than trying to place the silver under the top electrode. As a result, devices are faster, more temperature resilient, and have better cycling endurance.

The invention will now be explained with reference to FIGS. 1–10, which illustrate exemplary embodiments of a resistance variable memory element 100 in accordance with the invention. FIG. 1 depicts a portion of an insulating layer 12 formed over a semiconductor substrate 10, for example, a silicon substrate. It should be understood that the resistance variable memory element can be formed on a variety of substrate materials and not just semiconductor substrates such as silicon. For example, the insulating layer 12 may be formed on a plastic substrate. The insulating layer 12 may be formed by any known deposition method, such as, for example, sputtering by chemical vapor deposition (CVD), plasma enhanced CVD (PECVD) or physical vapor deposition (PVD). The insulating layer 12 may be formed of a conventional insulating oxide, such as silicon oxide ($SiO_2$), a silicon nitride ($Si_3N_4$), or a low dielectric constant material, among many others.

A first electrode 14 is next formed over the insulating layer 12, as also illustrated in FIG. 1. The first electrode 14 may comprise any suitable conductive material, such as, for example, tungsten, nickel, tantalum, aluminum, platinum, or silver, among many others. A first dielectric layer 15 is next formed over the first electrode 14. The first dielectric layer 15 may comprise the same or different materials as those described above with reference to the insulating layer 12.

Figure 2:
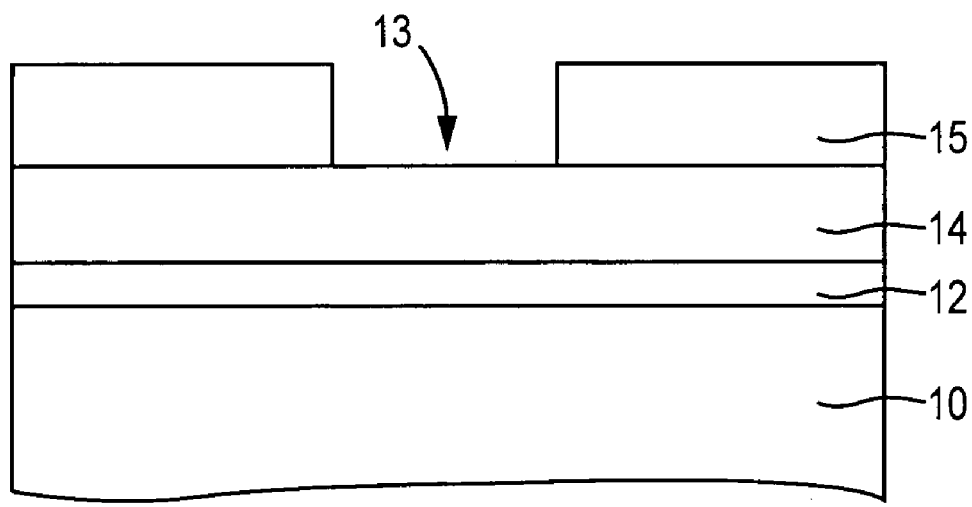
FIG. 2 is a cross-sectional view of the memory element of FIG. 1 at a stage of processing subsequent to that shown in FIG. 1.
Figure 3:
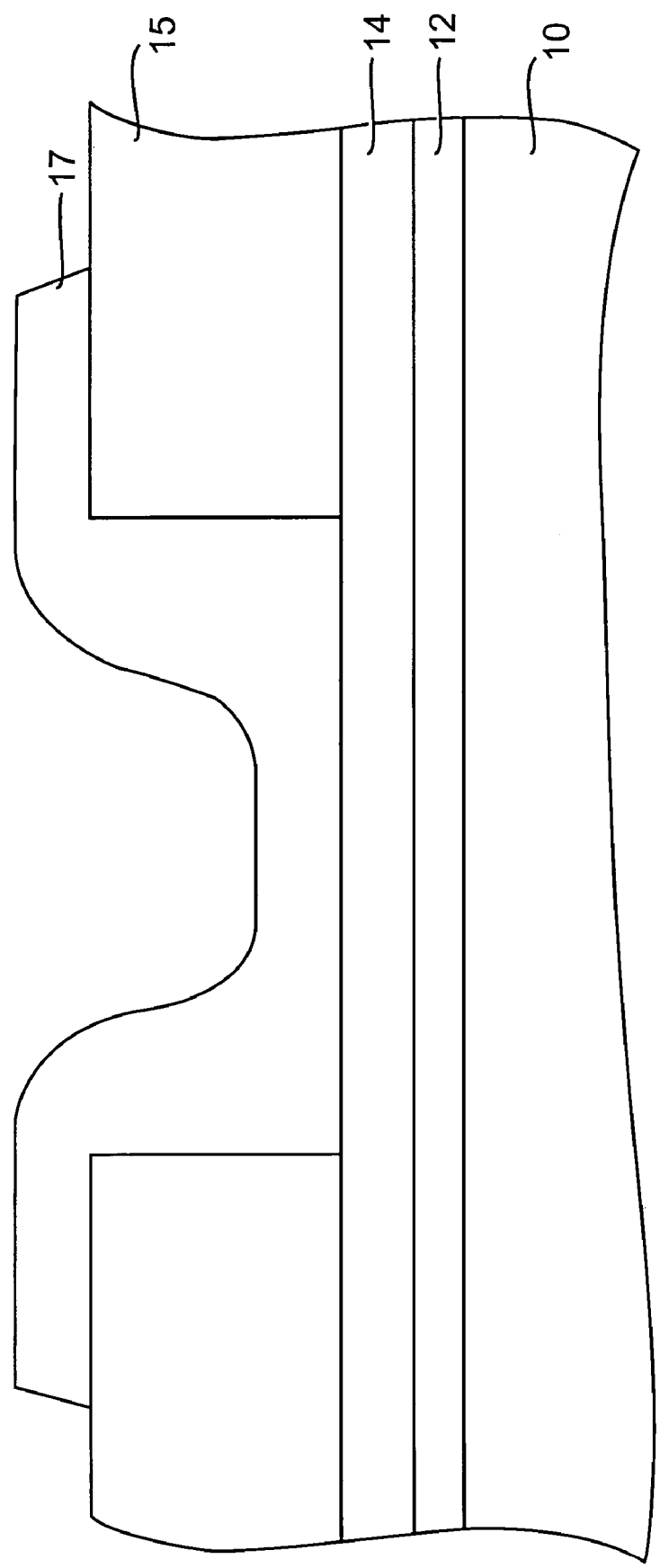
FIG. 3 is a cross-sectional view of the memory element of FIG. 1 at a stage of processing subsequent to that shown in FIG. 2.

Referring now to FIG. 2, an opening 13 extending to the first electrode 14 is formed in the first dielectric layer 15. The opening 13 may be formed by known methods in the art, such as, for example, by a conventional patterning and etching process. A first chalcogenide glass layer 17 is next formed over the first dielectric layer 15, to fill in the opening 13, as shown in FIG. 3.

According to a first embodiment of the invention, the first chalcogenide glass layer 17 is a germanium-selenide glass having a $Ge_xSe_{100-x}$ stoichiometry. The preferred stoichiometric range is between about $Ge_{20}Se_{80}$ to about $Ge_{43}Se_{57}$ and is more preferably about $Ge_{40}Se_{60}$. The first chalcogenide glass layer 17 preferably has a thickness of from about 100 Å to about 1000 Å, and more preferably has a thickness of about 150 Å.

The first chalcogenide glass layer serves as a glass backbone for allowing a metal-containing layer, such as a silver-selenide layer, to be directly deposited thereon. The use of a metal-containing layer, such as a silver-selenide layer, in contact with the chalcogenide glass layer makes it unnecessary to provide a metal (silver) doped chalcogenide glass, which would require photodoping of the substrate with ultraviolet radiation. However, it is possible to also metal (silver) dope the chalcogenide glass layer, which is in contact with the silver-selenide layer, as an optional variant.

The formation of the first chalcogenide glass layer 17, having a stoichiometric composition in accordance with the invention may be accomplished by any suitable method. For example, evaporation, co-sputtering germanium and selenium in the appropriate ratios, sputtering using a germanium-selenide target having the desired stoichiometry, or chemical vapor deposition with stoichiometric amounts of $GeH_4$ and $SeH_2$ gases (or various compositions of these gases), which result in a germanium-selenide film of the desired stoichiometry are examples of methods which may be used to form the first chalcogenide glass layer 17.

Figure 4:
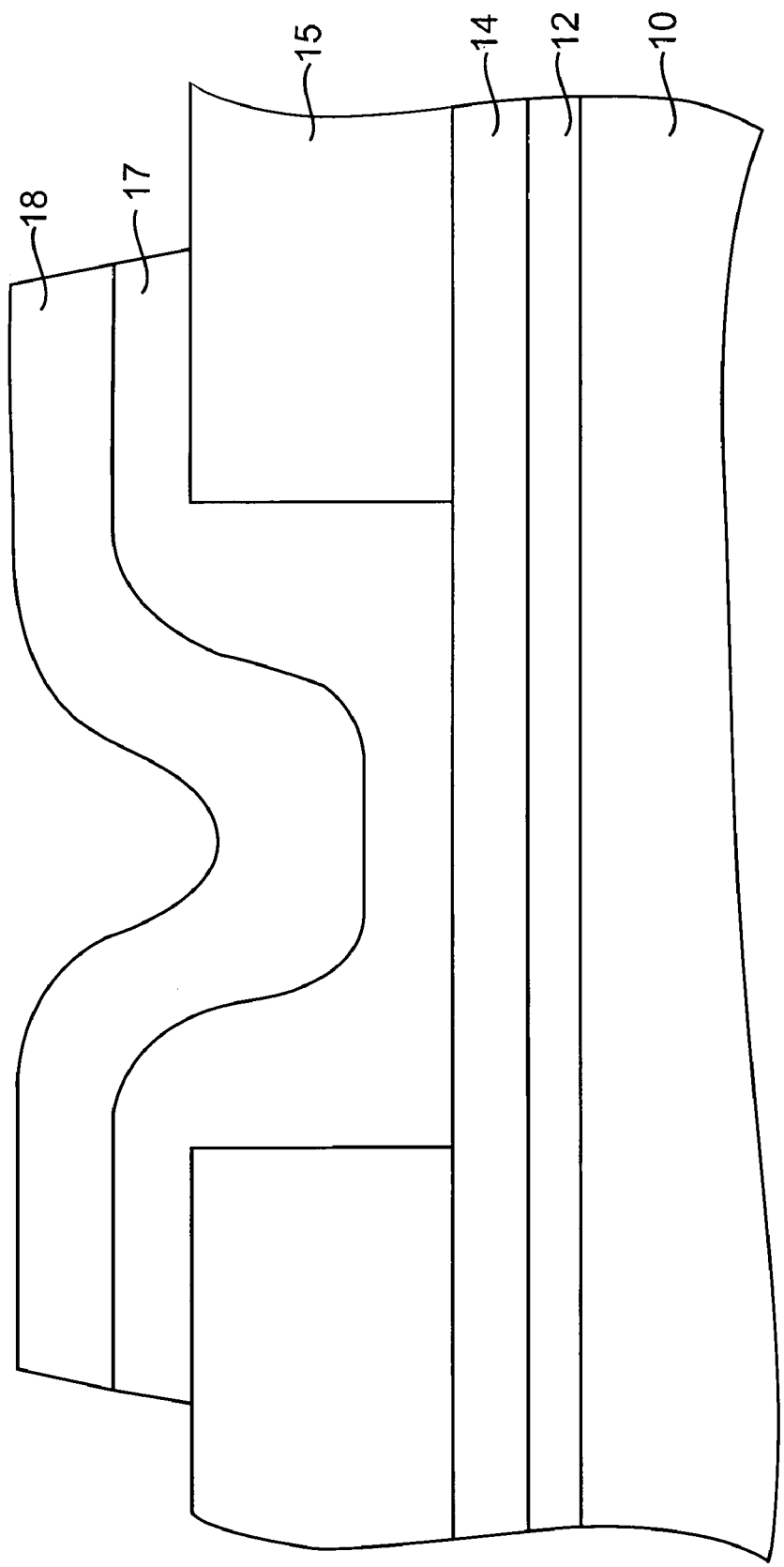
FIG. 4 is a cross-sectional view of the memory element of FIG. 1 at a stage of processing subsequent to that shown in FIG. 3.

Referring now to FIG. 4, a first metal-containing layer 18, preferably silver-selenide, is deposited over the first chalcogenide glass layer 17. Although the first metal-containing layer 18 is preferably silver-selenide, any suitable metal-containing layer may be used. For example, other suitable metal-containing layers include silver-chalcogenide layers. Silver sulfide, silver oxide, and silver telluride are all suitable silver-chalcogenides that may be used. A variety of processes can be used to form the metal-containing layer 18. For instance, physical vapor deposition techniques such as evaporative deposition and sputtering may be used. Other processes such as chemical vapor deposition, co-evaporation, or depositing a layer of selenium above a layer of silver to form silver-selenide can also be used.

The layers may be of any suitable thickness. The thickness of the layers depends upon the mechanism for switching. The thickness of the layers is such that the metal-containing layer 18 is thicker than the first chalcogenide glass layer 17. The metal-containing layer 18 is also thicker than a second glass layer 20 (the second glass layer 20 is described below). More preferably, the thickness of the layers is such that a ratio of the metal-containing layer 18 thickness to the first chalcogenide glass layer 17 thickness is between about 5:1 and about 1:1. That is, the thickness of the metal-containing layer is from about 1 to about 5 times greater than the thickness of the first chalcogenide glass layer. Even more preferably, the ratio of the metal-containing layer thickness to the first chalcogenide glass layer thickness is between about 3.1:1 and about 2:1.

Figure 5:
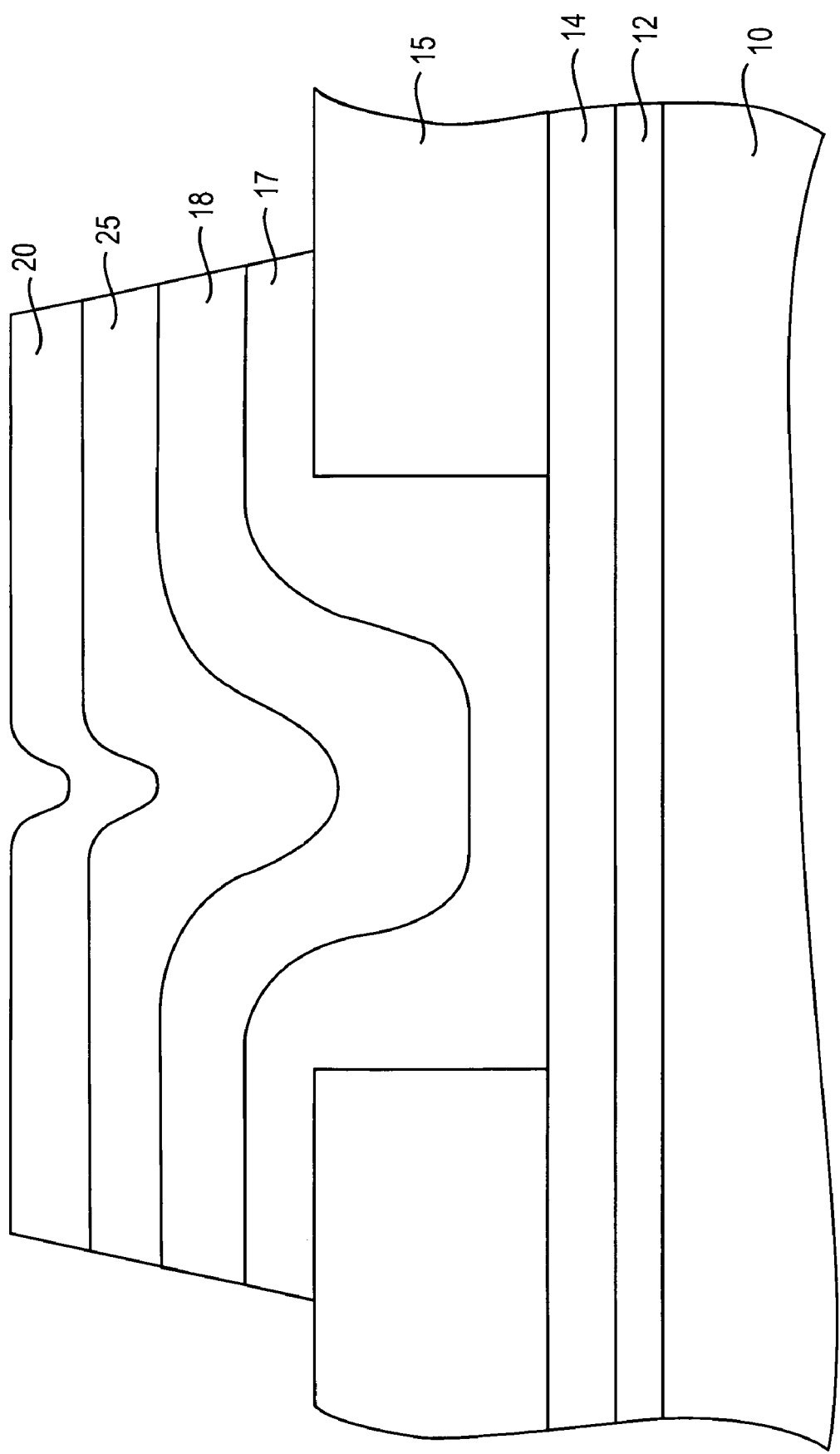
FIG. 5 is a cross-sectional view of the memory element of FIG. 1 at a stage of processing subsequent to that shown in FIG. 4.

Referring now to FIG. 5, a layer of silver 25 is formed over the first metal-containing layer 18. By using a low energy method of deposition, such as, for example, evaporation, the layer of silver 25 can be added directly onto the metal-containing layer 18. In a preferred embodiment, the silver layer 25 is employed with a metal-containing layer 18 that is a silver-selenide layer. The silver layer 25 preferably has a thickness of from about 50 Å to about 250 Å. In a variation of the first embodiment, a second layer of silver can be added so that a layer of silver is located on each side of the metal-containing layer 18. That is, a second silver layer is located on a side of the metal-containing layer opposite the side on which a first silver layer is located.

Adding the silver layer 25 directly to the metal-containing layer 18 is advantageous for at least the following reason. In general, a certain quantity of excess silver is required in a cell for the best operation. If a silver layer is located above a second glass layer, the silver must diffuse through the second glass layer. Thus, one must calculate the amount of silver that will diffuse through the second glass layer. Any variation in glass thickness or temperature, however, can limit the amount of silver diffusion. By adding the silver directly to the metal-containing layer, one can provide the exact amount of silver necessary rather than attempting to calculate diffusion through the second glass layer.

A second glass layer 20 is formed over the silver layer 25. One function of the second glass layer is to prevent or regulate migration of metal from an electrode into the element. Accordingly, although the exact mechanism by which the second glass layer may regulate or prevent metal migration is not clearly understood, the second glass layer may act as a metal diffusion control layer. For use as a diffusion control layer, any suitable glass may be used, including but not limited to, chalcogenide glasses. If the second glass layer is a chalcogenide glass, the second glass layer may, but need not, have the same stoichiometric composition as the first chalcogenide glass layer 17, i.e., $Ge_xSe_{100-x}$. Thus, the second glass layer 20 may be of a different material, different stoichiometry, and/or more rigid construction than the first chalcogenide glass layer 17.

The second glass layer 20, when used as a diffusion control layer, may generally comprise any suitable glass material with the exception of SiGe and GaAs. Suitable glass material compositions for the second glass layer 20 can include, for example, SiSe (silicon-selenide), AsSe (arsenic-selenide, such as $As_3Se_2$), GeS (germanium-sulfide), and combinations of Ge, Ag, and Se. Any one of the suitable glass materials may further comprise small concentrations, i.e., less than about 3%, of dopants including nitrides, metals, and other Group IIIA-VIA (13–16) elements.

The thickness of the layers is such that the metal-containing layer thickness is greater than the thickness of the second glass layer 20. Preferably, a ratio of the metal-containing layer thickness to the second glass layer thickness is between about 5:1 and about 1:1. More preferably, the ratio of the metal-containing layer thickness to the second glass layer thickness is between about 3.3:1 and about 2:1. The second glass layer 20 preferably has a thickness of from about 100 Å to about 1000 Å, and more preferably has a thickness of about 150 Å.

The formation of the second glass layer 20 may be effected by any suitable method. For instance, methods such as chemical vapor deposition, evaporation, co-sputtering, or sputtering using a target having the desired stoichiometry, may be used.

Figure 6:
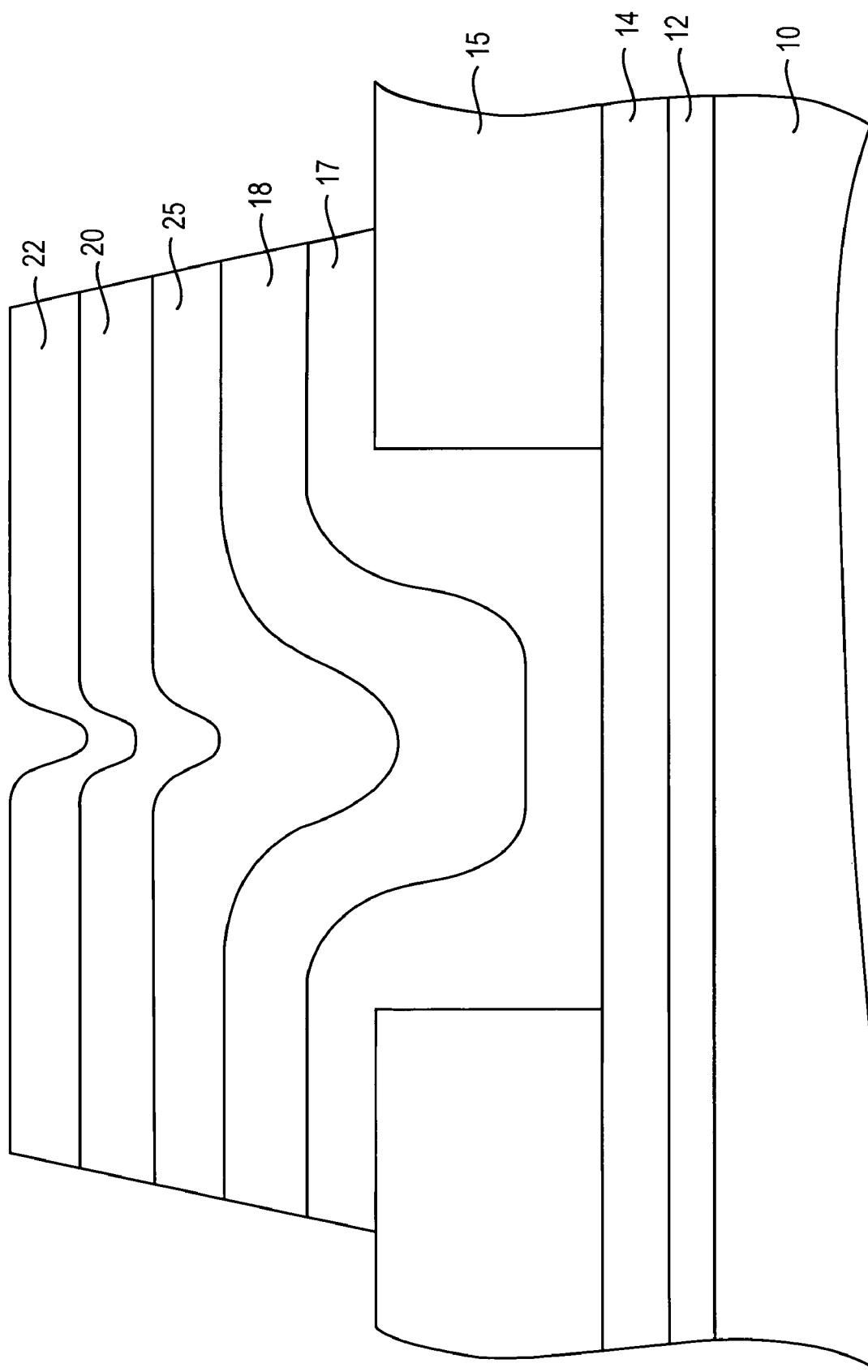
FIG. 6 is a cross-sectional view of the memory element of FIG. 1 at a stage of processing subsequent to that shown in FIG. 5.

Referring now to FIG. 6, a second conductive electrode material 22 is formed over the second glass layer 20. The second conductive electrode material 22 may comprise any electrically conductive material, such as, for example, tungsten, tantalum, or titanium, among many others. Thus, advantageously, the second glass layer 20 may be chosen to considerably slow or prevent migration of electrically conductive metals through the resistance variable memory element 100.

Figure 7:
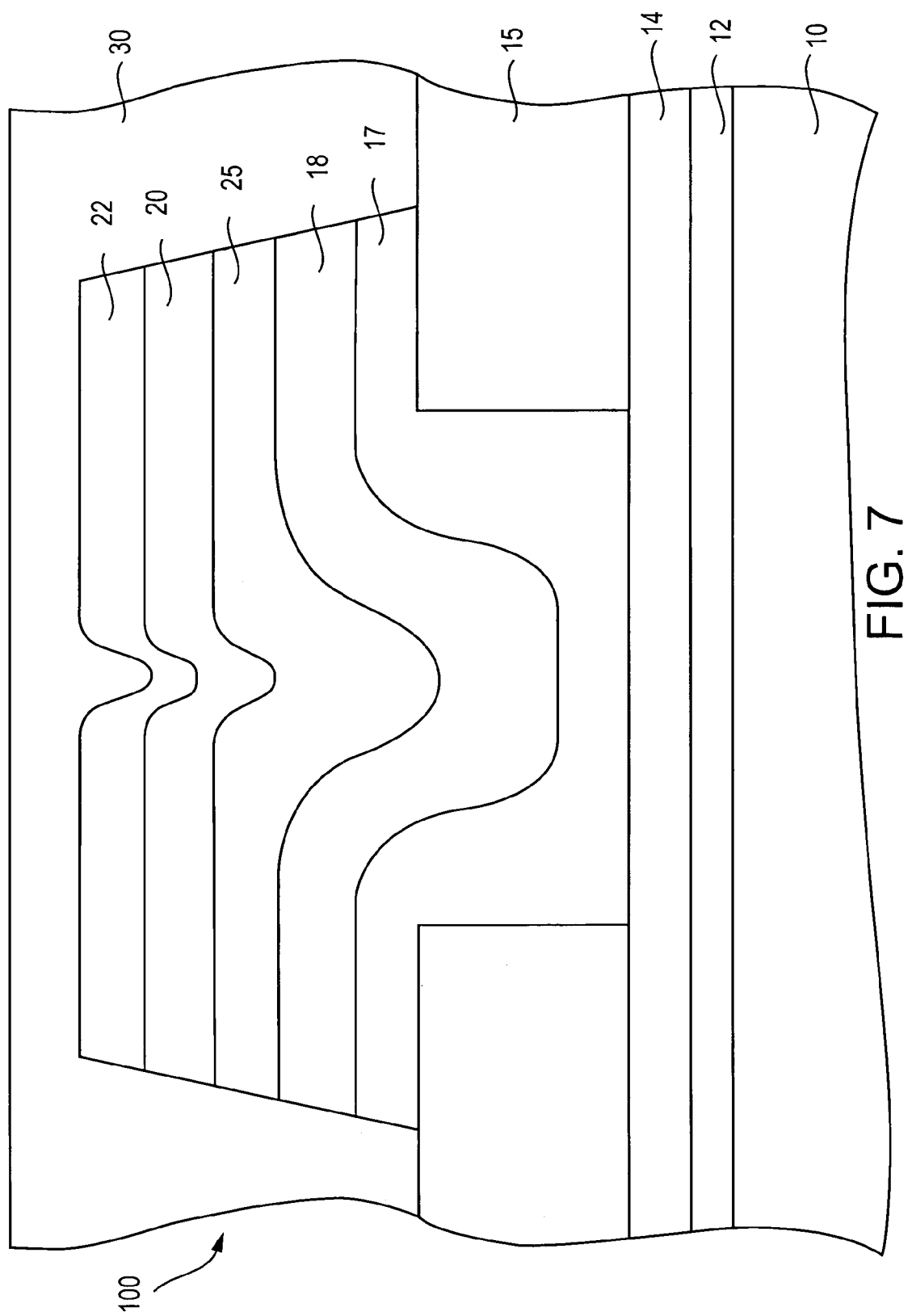
FIG. 7 is a cross-sectional view of the memory element of FIG. 1 at a stage of processing subsequent to that shown in FIG. 6.

Referring now to FIG. 7, one or more additional dielectric layers 30 may be formed over the second electrode 22 and the first dielectric layer 15 to isolate the resistance variable memory element 100 from other structure fabrication over the substrate 10. Conventional processing steps can then be carried out to electrically couple the second electrode 22 to various circuits of memory arrays.

Figure 8:
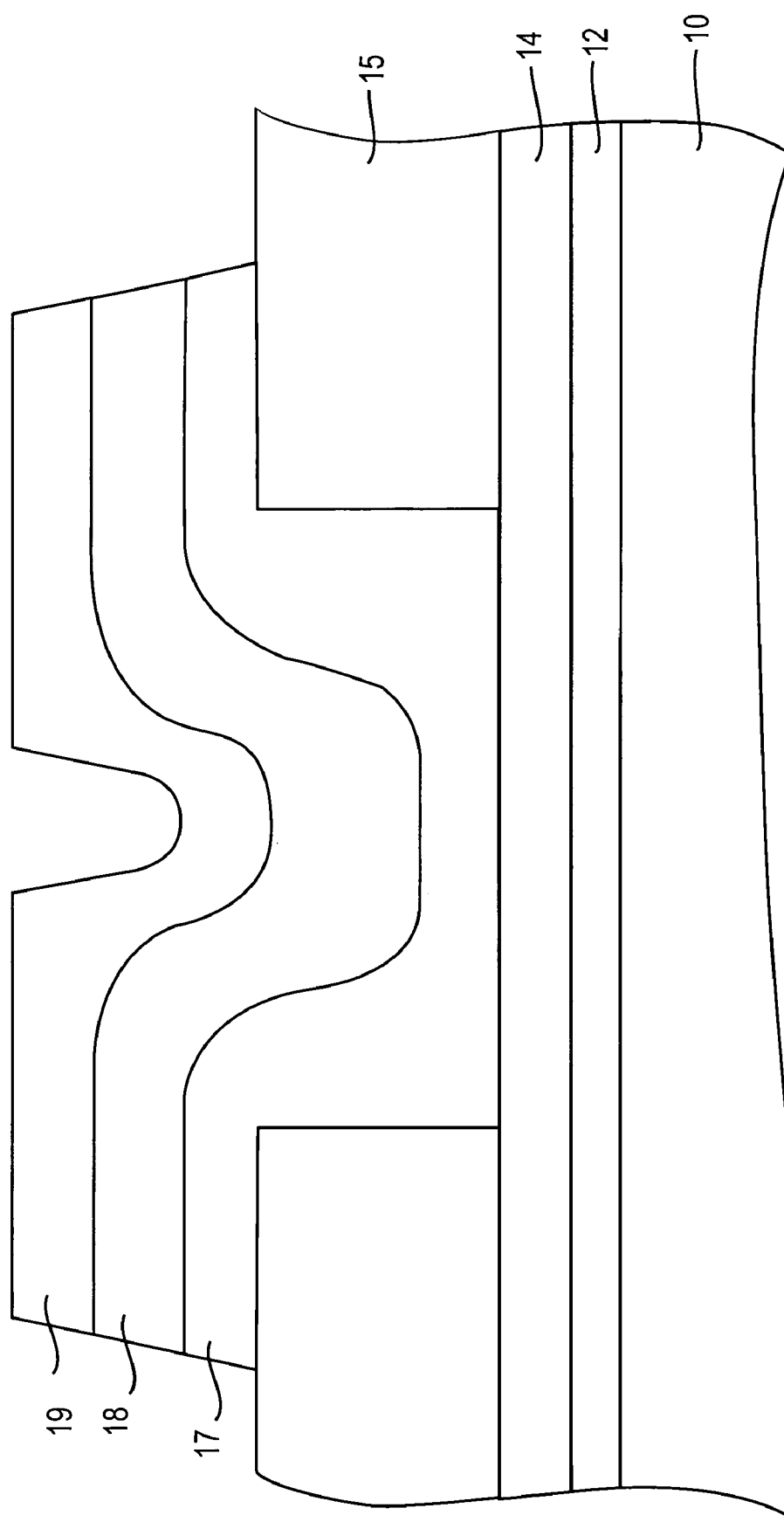
FIG. 8 is a cross-sectional view of the memory element of FIG. 1 in accordance with a variation of the first embodiment of the invention at a stage of processing subsequent to that shown in FIG. 4.

In accordance with a variation of the first embodiment of the invention, one or more layers of a metal-containing material, such as silver-selenide, may be deposited on the first chalcogenide glass layer 17. Any number of metal-containing layers may be used. As shown in FIG. 8, an optional second metal-containing layer 19 may be deposited on the first metal-containing layer 18 subsequent to the processing step shown in FIG. 4.

The thickness of the layers is such that the total thickness of the combined metal-containing layers, e.g. silver-selenide layers, is greater than or equal to the thickness of the first chalcogenide glass layer 17. The total thickness of the combined metal-containing layers is also greater than the thickness of the second glass layer 20. It is preferred that the total thickness of the combined metal-containing layers is from about 1 to about 5 times greater than the thickness of the first chalcogenide glass layer 17, and accordingly, from about 1 to about 5 times greater than the thickness of the second glass layer 20. It is even more preferred that the total thickness of the combined metal-containing layers is from about 2 to about 3.3 times greater than the thickness of the first chalcogenide glass layer 17, and from about 2 to about 3.3 times greater than the thickness of the second glass layer 20.

In accordance with yet another variation of the invention, the first chalcogenide glass layer 17 may comprise one or more layers of a chalcogenide glass material, such as, for example, germanium-selenide. The second glass layer 20 may also comprise one or more layers of a glass material. The first chalcogenide glass layer 17 and/or the second glass layer 20 may comprise any suitable number of layers. However, it is to be understood that the total thickness of the metal-containing layer(s) should be thicker than the total thickness of the one or more layers of chalcogenide glass. Additionally, the total thickness of the metal-containing layer(s) should be thicker than the total thickness of the one or more layers of the second glass layer. Preferably a ratio of the total thickness of the metal-containing layer(s) to the total thickness of the one or more layers of chalcogenide glass is between about 5:1 and about 1:1. Also, preferably a ratio of the total thickness of the metal-containing layer(s) to the total thickness of the one or more layers of the second glass layer is between about 5:1 and about 1:1. It is even more preferred that the total thickness of the metal-containing layer(s) is from about 2 to about 3.3 times greater than the total thicknesses of the combined one or more layers of chalcogenide glass, and that the total thickness of the metal-containing layer(s) is from about 2 to about 3.3 times greater than the total thickness of the combined one or more layers of the second glass.

In accordance with yet another variant of the invention, one or more of the chalcogenide glass layers and second glass layers may also be doped with a dopant, such as a metal, preferably silver.

Figure 9:
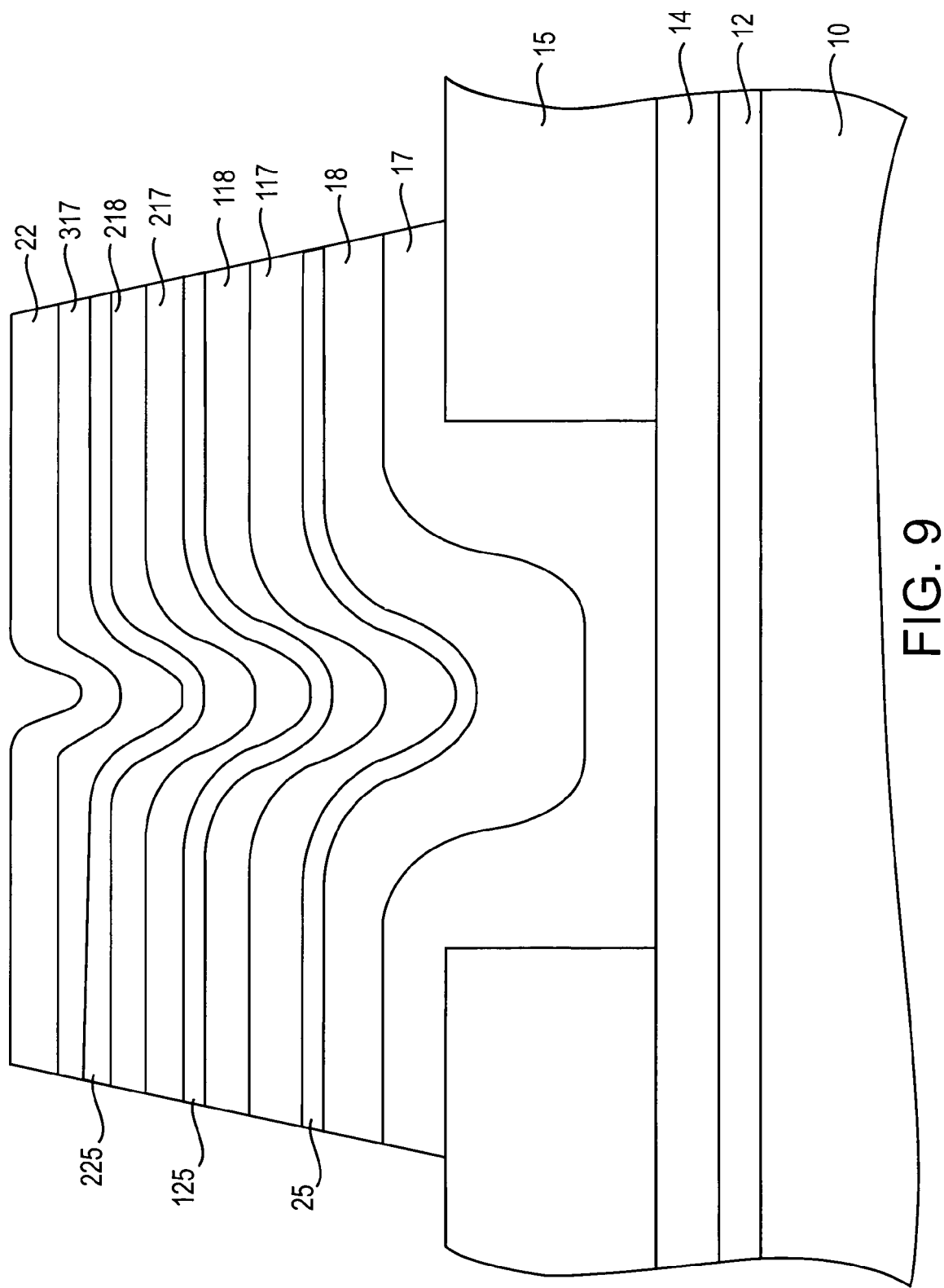
FIG. 9 is a cross-sectional view of a second embodiment of the memory element of the invention at a stage of processing subsequent to that shown in FIG. 4.
Figure 10:
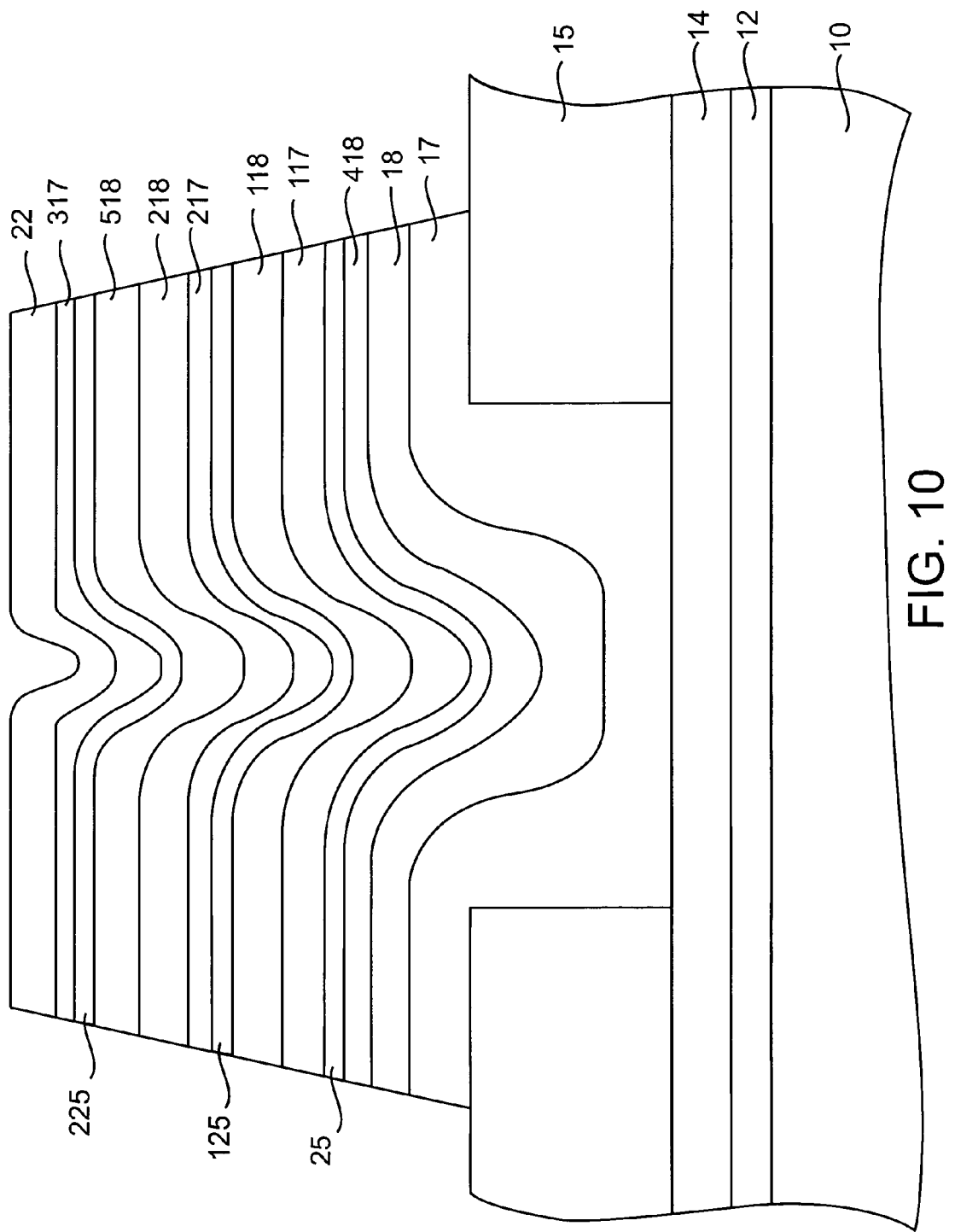
FIG. 10 is a cross-sectional view of a variation of the second embodiment of the memory element of the invention at a stage of processing subsequent to that shown in FIG. 4.

Referring now to FIG. 9, which shows a second embodiment of the invention subsequent to the processing step shown in FIG. 4, the stack of layers formed between the first and second electrodes may include alternating layers of chalcogenide glass, a metal-containing layer such as a silver-selenide layer, and a silver layer. As shown in FIG. 9, a first chalcogenide glass layer 17 is stacked atop a first electrode 14, a first metal-containing layer 18 is stacked atop the first chalcogenide glass layer 17, a first silver layer 25 is stacked atop the first metal-containing layer 18, a second chalcogenide glass layer 117 is stacked atop the first silver layer 25, a second metal-containing layer 118 is stacked atop the second chalcogenide glass layer 117, a second silver layer 125 is stacked atop the second metal-containing layer 118, a third chalcogenide glass layer 217 is stacked atop the second silver layer 125, a third metal-containing layer 218 is stacked atop the third chalcogenide glass layer 217, a third silver layer 225 is stacked atop the third metal-containing layer 218, and a fourth chalcogenide glass layer 317 is stacked atop the third silver layer 225. The second conductive electrode 22 is formed over the fourth chalcogenide glass layer 317.

In accordance with the above-described second embodiment, the stack comprises at least three metal-containing layers, at least three silver layers, and at least four chalcogenide glass layers. However, it is to be understood that the stack may comprise numerous alternating chalcogenide glass layers, metal-containing layers, and silver layers, so long as the alternating layers start with a first chalcogenide glass layer and end with a last chalcogenide glass layer, with the first chalcogenide glass layer contacting a first electrode and the last chalcogenide glass layer contacting a second electrode. The thicknesses and ratios of the alternating metal-containing layers, silver layers, and chalcogenide glass layers are the same as described above, in that the metal-containing layers are preferably thicker than connecting chalcogenide glass layers. That is, a ratio of the metal-containing layers thickness to the connected chalcogenide glass layers thickness is between about 5:1 and about 1:1, and is more preferably between about 3.3:1 and 2:1.

In a variation of the second embodiment, one or more layers of a metal-containing material, such as, for example, silver-selenide, may be deposited between the chalcogenide glass layers. Any number of metal-containing layers may be used. As shown FIG. 10 at a processing step subsequent to that shown in FIG. 4, an additional metal-containing layer 418 may be deposited on the first silver-selenide layer 18, with a silver layer 25 deposited on metal-containing layer 418, and an additional metal-containing layer 518 may be deposited on the third metal-containing layer 218, with a silver layer 225 deposited on metal-containing layer 518.

In accordance, with yet another variation of the invention, each of the chalcogenide glass layers may comprise one or more thinner layers of a chalcogenide glass material, such as, for example, germanium-selenide. Any suitable number of layers may be used to comprise the chalcogenide glass layers.

In yet another variation of the second embodiment of the invention, one or more of the chalcogenide glass layers may also be doped with a dopant such as a metal, preferably comprising silver.

Devices constructed according to the first embodiment of the invention, particularly, those having a silver-selenide layer and a silver layer disposed between two chalcogenide glass layers, show improved memory retention and write/erase performance over conventional memory devices. These devices have also shown low resistance memory retention of greater than 1200 hours at room temperature. The devices switch at pulse widths of less than 2 nanoseconds compared with conventional doped resistance variable memory elements that switch at about 100 nanoseconds. In addition, the devices are more temperature resilient and have better cycling endurance.

Although the embodiments described above refer to the formation of only one resistance variable memory element 100, it should be understood that the invention contemplates the formation of any number of such resistance variable memory elements, which can be fabricated in a memory array and operated with memory element access circuits.

Figure 11:
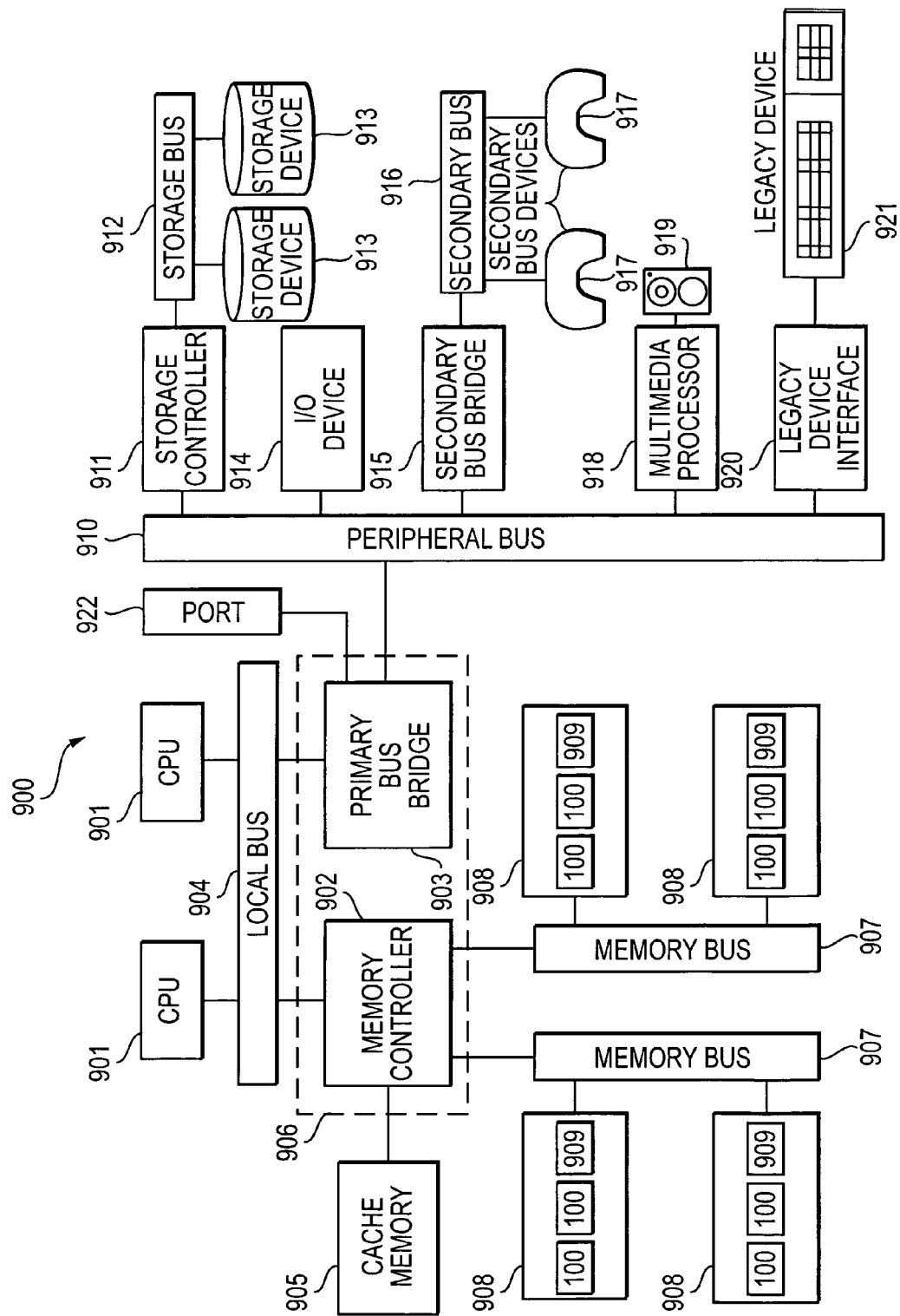
FIG. 11 illustrates a processing system having a memory element formed according to the invention.

FIG. 11 illustrates an exemplary processing system 900 which may utilize the memory device 100 of the present invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 100 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, and a legacy device interface 920. The primary bus bridge 903 may also be coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge may be used to interface additional devices via another bus to the processing system. For example, the secondary bus bridge may be a universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 11 is only an exemplary processing system with which the invention may be used. While FIG. 11 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The above description and the drawings are only to be considered illustrative of exemplary embodiments which achieve the features and advantages of the invention. Modifications of, and substitutions to, specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A resistance variable memory element comprising:
a plurality of layers configured to maintain a resistance state set by a programming voltage applied across said plurality of layers, said plurality of layers comprising:
at least one chalcogenide glass layer,
at least one metal-containing layer,
at least one silver layer provided adjacent to said metal-containing layer, and
at least one other glass layer,
said at least one metal-containing layer and said at least one silver layer being provided between said at least one chalcogenide glass layer and said at least one other glass layer.

2. The memory element of claim 1 wherein said at least one chalcogenide glass layer comprises a plurality of chalcogenide glass layers.

3. The memory element of claim 1 wherein said at least one other glass layer comprises a plurality of glass layers.

4. The memory element of claim 1 wherein said at least one metal-containing layer comprises a silver-chalcogenide.

5. The memory element of claim 1 wherein said at least one metal-containing layer comprises silver-selenide.

6. The memory element of claim 1 wherein said at least one metal-containing layer comprises silver-sulfide.

7. The memory element of claim 1 wherein said at least one metal-containing layer comprises silver-oxide.

8. The memory element of claim 1 wherein said at least one metal-containing layer comprises silver-telluride.

9. The memory element of claim 4 wherein said at least one chalcogenide glass layer comprises a material having a stoichiometric formula of $Ge_xSe_{100-x}$, wherein $20\alpha x\alpha 43$.

10. The memory element of claim 9 wherein said material has the formula of about $Ge_{40}Se_{60}$.

11. The memory element of claim 4 wherein said at least one other glass layer comprises a second chalcogenide glass layer.

12. The memory element of claim 4 wherein said at least one other glass layer comprises an SiSe composition.

13. The memory element of claim 4 wherein said at least one other glass layer comprises an AsSe composition.

14. The memory element of claim 4 wherein said at least one other glass layer comprises a GeS composition.

15. The memory element of claim 4 wherein said at least one other glass layer comprises a combination of germanium, silver, and selenium.

16. The memory element of claim 1 wherein said at least one other glass layer has a thickness between about 100 Å and about 1000 Å.

17. The memory element of claim 1 wherein said at least one other glass layer has a thickness of about 150 Å.

18. The memory element of claim 1 wherein said at least one chalcogenide glass layer has a thickness between about 100 Å and about 1000 Å.

19. The memory element of claim 1 wherein said at least one chalcogenide glass layer has a thickness of about 150 Å.

20. The memory element of claim 1 wherein said at least one metal-containing layer has a first thickness and said at least one chalcogenide glass layer has a second thickness whereby a thickness ratio of said first thickness to said second thickness is between about 5:1 to about 1:1.

21. The memory element of claim 1 wherein said at least one metal-containing layer has a first thickness and said at least one chalcogenide glass layer has a second thickness whereby a thickness ratio of said first thickness to said second thickness is between about 3.3:1 to about 2:1.

22. The memory element of claim 1 wherein said at least one metal-containing layer comprises a plurality of stacked metal-containing layers.

23. The memory element of claim 1 wherein said at least one other glass layer comprises at least one second chalcogenide glass layer.

24. The memory element of claim 23 further comprising at least one second metal-containing layer in contact with said at least one second chalcogenide glass layer, a second silver layer in contact with said second metal-containing layer, and at least one third chalcogenide glass layer in contact with said second silver layer.

25. The memory element of claim 1 wherein one or more of said at least one chalcogenide glass layers contains a metal dopant.

26. The memory element of claim 25 wherein said metal dopant comprises silver.

27. The memory element of claim 1 wherein said at least one metal-containing layer has a first thickness and said at least one other glass layer has a second thickness whereby a thickness ratio of said first thickness to said second thickness is between about 5:1 to about 1:1.

28. The memory element of claim 1 wherein said at least one metal-containing layer has a first thickness and said at least one other glass layer has a second thickness whereby a thickness ratio of said first thickness to said second thickness is between about 3.3:1 to about 2:1.

29. The memory element of claim 1 wherein said at least one metal-containing layer has a thickness equal to or greater than a thickness of each of said at least one chalcogenide glass layer and said at least one other glass layer.

30. The memory element of claim 1 wherein said silver layer is an evaporated silver layer.

31. The memory element of claim 1 wherein said silver layer has a thickness of from about 50 Å to about 250 Å.

32. The memory element of claim 1 further comprising a second silver layer located on a side of said metal-containing layer opposite the side on which said at least one silver layer is located.

33. A resistance variable memory element comprising:
a first glass layer in contact with at least one silver-chalcogenide layer, and at least one silver layer in contact with said silver-chalcogenide layer, said silver layer being in contact with a second glass layer, wherein at least one of said first and second glass layers is formed of a chalcogenide glass material; and
a first electrode and a second electrode in respective contact with said first and second glass layers.

34. The memory element of claim 33 wherein said at least one silver-chalcogenide layer comprises silver-selenide.

35. The memory element of claim 33 wherein said at least one silver-chalcogenide layer comprises silver-sulfide.

36. The memory element of claim 33 wherein said at least one silver-chalcogenide layer comprises silver-oxide.

37. The memory element of claim 33 wherein said at least one silver-chalcogenide layer comprises silver-telluride.

38. The memory element of claim 33 wherein said chalcogenide glass material has a stoichiometric formula of $Ge_xSe_{100-x}$, wherein $20 \alpha x \alpha 43$.

39. The memory element of claim 33 wherein said material has the formula of about $Ge_{40}Se_{60}$.

40. The memory element of claim 33 wherein both said first glass layer and said second glass layer comprise a chalcogenide glass material.

41. The memory element of claim 33 wherein at least one of said first and second glass layers contains a metal dopant.

42. The memory element of claim 41 wherein said metal dopant comprises silver.

43. The memory element of claim 33 wherein at least another of said first and second glass layers comprises an SiSe composition.

44. The memory element of claim 33 wherein at least another of said first and second glass layers comprises an AsSe composition.

45. The memory element of claim 33 wherein at least another of said first and second glass layers comprises a GeS composition.

46. The memory element of claim 33 wherein at least another of said first and second glass layers comprises a combination of germanium, silver, and selenium.

47. The memory element of claim 33 wherein said silver-chalcogenide layer has a first thickness, said second glass layer has a second thickness, and a thickness ratio of said first thickness to said second thickness is between about 5:1 to about 1:1.

48. The memory element of claim 33 wherein said silver-chalcogenide layer has a first thickness, said second glass layer has a second thickness, and a thickness ratio of said first thickness to said second thickness is between about 3.3:1 to about 2:1.

49. The memory element of claim 33 wherein said silver-chalcogenide layer has a first thickness and said first glass layer has a second thickness and a thickness ratio of said first thickness to said second thickness is between about 5:1 to about 1:1.

50. The memory element of claim 33 wherein said silver-chalcogenide layer has a first thickness, said first glass layer has a second thickness, and a thickness ratio of said first thickness to said second thickness is between about 3.3:1 to about 2:1.

51. The memory element of claim 33 wherein said silver-chalcogenide layer has a thickness greater than or equal to the thickness of each of said first and second glass layers.

52. The memory element of claim 33 wherein said silver layer is an evaporated silver layer.

53. The memory element of claim 33 wherein said silver layer has a thickness of from about 50 Å to about 250 Å.

54. The memory element of claim 33 further comprising a second silver layer located on a side of said metal-containing layer opposite the side on which said at least one silver layer is located.

55. A memory element comprising:
a first electrode;
a first glass layer comprising $Ge_xSe_{100-x}$, wherein $20 \alpha x \alpha 43$, said first glass layer being in contact with said first electrode;
a first metal-containing layer in contact with said first glass layer;
a first silver layer in contact with said first metal-containing layer;
a second glass layer in contact with said first silver layer; and
a second electrode in contact with said second glass layer.

56. The memory element of claim 55 wherein x is about 40.

57. The memory element of claim 55 wherein said first metal-containing layer comprises a silver-chalcogenide.

58. The memory element of claim 55 wherein said first metal-containing layer comprises silver-selenide.

59. The memory element of claim 55 wherein said first metal-containing layer comprises silver-sulfide.

60. The memory element of claim 55 wherein said first metal-containing layer comprises silver-oxide.

61. The memory element of claim 55 wherein said first metal-containing layer comprises silver-telluride.

62. The memory element of claim 55 wherein said second glass layer acts as a diffusion control layer to control diffusion of components from said second electrode through said silver layer, said metal-containing layer, and said first glass layer.

63. The memory element of claim 55 wherein said second glass layer comprises an SiSe composition.

64. The memory element of claim 55 wherein said second glass layer comprises an AsSe composition.

65. The memory element of claim 55 wherein said second glass layer comprises a GeS composition.

66. The memory element of claim 55 wherein said second glass layer comprises a combination of germanium, silver, and selenium.

67. The memory element of claim 55 wherein said first metal-containing layer comprises a plurality of metal-containing layers in serial contact with each other.

68. The memory element of claim 55 wherein at least one of said first glass layer and said second glass layer comprises a plurality of glass layers in serial contact with each other.

69. The memory element of claim 55 wherein at least one of said first and second glass layers contains a metal dopant.

70. The memory element of claim 69 wherein said metal dopant comprises silver.

71. The memory element of claim 55 wherein said first silver layer is an evaporated silver layer.

72. The memory element of claim 55 wherein said first silver layer has a thickness of from about 50 Å to about 250 Å.

73. The memory element of claim 55 further comprising a second silver layer located on a side of said metal-containing layer opposite the side on which said first silver layer is located.

74. A chalcogenide glass stack comprising:
a chalcogenide glass layer;
at least one metal-containing layer in contact with said chalcogenide glass layer;
at least one silver layer in contact with said metal-containing layer; and
a diffusion control layer in contact with said silver layer for controlling diffusion of elements into said chalcogenide glass layer.

75. The chalcogenide glass stack of claim 74 wherein said diffusion control layer is a second glass layer.

76. The chalcogenide glass stack of claim 74 further comprising a metal-containing electrode in contact with said diffusion control layer and wherein said diffusion control layer slows migration of a metal from said electrode into said chalcogenide glass layer.

77. The chalcogenide glass stack of claim 74 wherein said at least one metal-containing layer comprises a silver-chalcogenide.

78. The chalcogenide glass stack of claim 74 wherein said at least one metal-containing layer comprises silver-selenide.

79. The chalcogenide glass stack of claim 74 wherein said at least one metal-containing layer comprises silver-sulfide.

80. The chalcogenide glass stack of claim 74 wherein said at least one metal-containing layer comprises silver-oxide.

81. The chalcogenide glass stack of claim 74 wherein said at least one metal-containing layer comprises silver-telluride.

82. The chalcogenide glass stack of claim 74 wherein at least one or both of said chalcogenide glass layer and said diffusion control layer contains a metal dopant.

83. The chalcogenide glass stack of claim 82 wherein said metal dopant comprises silver.

84. The chalcogenide glass stack of claim 74 wherein said silver layer is an evaporated silver layer.

85. The chalcogenide glass stack of claim 74 wherein said silver layer has a thickness of from about 50 Å to about 250 Å.

86. The chalcogenide glass stack of claim 74 further comprising a second silver layer located on a side of said metal-containing layer opposite the side on which said at least one silver layer is located.

87. A memory element comprising:
a first electrode;
at least one first chalcogenide glass layer in contact with said first electrode;
at least one first metal-containing layer in contact with said at least one first chalcogenide glass layer;
a first silver layer in contact with at said least one first metal-containing layer;
at least one second chalcogenide glass layer in contact with said first silver layer;
at least one second metal-containing layer in contact with said at least one second chalcogenide glass layer;
a second silver layer in contact with at said least one second metal-containing layer;
at least one third chalcogenide glass layer in contact with said second silver layer; and
a second electrode in contact with said at least one third chalcogenide glass layer.

88. The memory element of claim 87 wherein said metal-containing layers comprise one or more silver-selenide layers.

89. The memory element of claim 87 wherein one or more of said chalcogenide glass layers comprise a plurality of chalcogenide glass layers.

90. The memory element of claim 87 wherein one or more of said metal-containing layers comprises a plurality of metal-containing layers.

91. The memory element of claim 87 wherein one or more of said chalcogenide glass layers contains a metal dopant.

92. The memory element of claim 91 wherein said metal dopant comprises silver.

93. The memory element of claim 87 wherein each of said first and second silver layers is an evaporated silver layer.

94. The memory element of claim 87 wherein said first silver layer has a thickness of from about 50 Å to about 250 Å.

95. The memory element of claim 87 further comprising a third silver layer located on a side of said first metal-containing layer opposite the side on which said first silver layer is located, and a fourth silver layer located on a side of said second metal-containing layer opposite the side on which said second silver layer is located.

96. A method of forming a resistance variable memory element comprising the steps of:
forming a first electrode;
forming a first chalcogenide glass layer in contact with said first electrode;
forming a first metal-containing layer in contact with said first chalcogenide glass layer;
forming a first silver layer in contact with said first metal-containing layer;
forming a second chalcogenide glass layer in contact with said first silver layer;
forming a second metal-containing layer in contact with said second chalcogenide glass layer;
forming a second silver layer in contact with said second metal-containing layer;
forming a third chalcogenide glass layer in contact with said second silver layer; and
forming a second electrode in contact with said third chalcogenide glass layer.

97. The method of claim 96 wherein said chalcogenide glass layers comprise a material having the stoichiometric formula $Ge_xSe_{100-x}$, wherein $20\alpha x\alpha 43$.

98. The method of claim 96 wherein said chalcogenide glass layers have a stoichiometry of about $Ge_{40}Se_{60}$.

99. The method of claim 96 wherein said chalcogenide glass layers comprise a plurality of chalcogenide glass layers.

100. The method of claim 96 wherein said metal-containing layers comprise a plurality of metal-containing layers.

101. The method of claim 96 wherein one or more of said chalcogenide glass layers contain a metal dopant.

102. The method of claim 96 wherein one or more of said metal-containing layers comprises silver-selenide.

103. The method of claim 101 wherein said metal dopant comprises silver.

104. The method of claim 96 wherein said metal-containing layers have a thickness which is equal to or greater than the thickness of each of said chalcogenide glass layers.

105. The method of claim 96 wherein each of said metal-containing layers has a first thickness and each of said chalcogenide glass layers has a second thickness whereby a thickness ratio of said first thickness to said second thickness is between about 5:1 to about 1:1.

106. The method of claim 105 wherein said thickness ratio of said first thickness to said second thickness is between about 3.3:1 to about 2:1.

107. The method of claim 96 wherein each of said first and second silver layers is an evaporated silver layer.

108. The method of claim 96 wherein each of said first and second silver layers has a thickness of from about so 50 Å to about 250 Å.

109. The method of claim 96 further comprising a third silver layer located on a side of said first metal-containing layer opposite the side on which said first silver layer is located, and a fourth silver layer located on a side of said second metal-containing layer opposite the side on which said second silver layer is located.

110. A method of forming a resistance variable memory element comprising a plurality of layers configured for retaining stored data as a resistance value and for exhibiting a resistance change in response to an applied programming voltage, said method comprising:
forming a first glass layer;
forming a silver-selenide layer in contact with said first glass layer;

forming at least one silver layer in contact with said silver-selenide layer; and forming a second glass layer in contact with said silver layer, whereby one of said first and second glass layers is a formed of a chalcogenide glass material.

111. The method of claim 110 wherein said chalcogenide glass material has a stoichiometric composition of about $Ge_{40}Se_{60}$.

112. The method of claim 110 wherein at least one of said glass layers contains a metal dopant.

113. The method of claim 112 wherein said metal dopant comprises silver.

114. The method of claim 110 wherein both of said first and second glass layers comprises a chalcogenide glass material.

115. The method of claim 110 further comprising the step of forming alternating layers of said chalcogenide glass material, said silver-selenide layer, and said silver layer.

116. The method of claim 110 wherein said first or said second glass layer formed of said chalcogenide glass material further contains a metal dopant.

117. The method of claim 116 wherein said metal dopant comprises silver.

118. The method of claim 110 wherein another of said first and second glass layers controls diffusion of a metal ion from an electrode through said memory element.

119. The method of claim 118 wherein said other glass layer comprises an SiSe composition.

120. The method of claim 118 wherein said other glass layer comprises an AsSe composition.

121. The method of claim 118 wherein said other glass layer comprises a GeS composition.

122. The method of claim 118 wherein said other glass layer comprises a combination of germanium, silver, and selenium.

123. The method of claim 92 wherein said metal-containing layer has a thickness which is equal to or greater than a thickness of each of said first and second glass layers.

124. The method of claim 110 wherein said metal-containing layer comprises a plurality of silver-selenide layers in serial contact with each other.

125. The method of claim 110 wherein said silver layer is an evaporated silver layer.

126. The method of claim 110 wherein said silver layer has a thickness of from about 50 Å to about 250 Å.

127. The method of claim 110 further comprising a second silver layer located on a side of said silver-selenide layer opposite the side on which said at least one silver layer is located.

128. A processor-based system, comprising:
a processor; and
a memory circuit connected to said processor, said memory circuit including a resistance variable memory element comprising a plurality of layers configured to maintain a resistance state set by a programming voltage across said plurality of layers, said plurality of layers comprising at least one metal-containing layer, at least one silver layer in contact with said at least one metal-containing layer, at least one chalcogenide glass layer, at least one other glass layer, said metal-containing layer and said silver layer being provided between said at least one chalcogenide glass layer and said at least one other glass layer.

129. The system of claim 128 wherein said chalcogenide glass layer comprises a material having the formula $Ge_xSe_{100-x}$, wherein $20 \alpha x \alpha 43$.

130. The system of claim 129 wherein said chalcogenide glass layer stoichiometry is about $Ge_{40}Se_{60}$.

131. The system of claim 128 wherein at least one of said glass layers contains a metal dopant.

132. The system of claim 131 wherein said metal dopant comprises silver.

133. The system of claim 128 wherein said other glass layer comprises a second chalcogenide glass layer.

134. The system of claim 128 further comprising a second metal-containing layer in contact with said at least one second chalcogenide glass layer, a second silver layer in contact with said second metal-containing layer, and at least one third chalcogenide glass layer in contact with said second silver layer.

135. The system of claim 128 wherein said chalcogenide glass layer comprises a plurality of stacked chalcogenide glass layers.

136. The system of claim 128 wherein said metal-containing layer comprises a plurality of stacked metal-containing layers.

137. The system of claim 128 wherein at least one of said chalcogenide glass layers comprises a metal dopant.

138. The system of claim 128 wherein said metal-containing layer comprises silver-selenide layer.

139. The system of claim 128 wherein said other glass layer comprises an SiSe composition.

140. The system of claim 128 wherein said other glass layer comprises an AsSe composition.

141. The system of claim 128 wherein said other glass layer comprises a GeS composition.

142. The system of claim 128 wherein said other glass layer comprises a combination of germanium, silver, and selenium.

143. The system of claim 128 wherein said other glass layer is a diffusion control layer for slowing migration of a metal ion from an electrode connected thereto.

144. The system of claim 128 wherein at least one of said silver layers is an evaporated silver layer.

145. The system of claim 128 wherein each of said first and second silver layers has a thickness of from about 50 Å to about 250 Å.

146. A processor-based system, comprising:
a processor;
a memory circuit connected to said processor, said memory circuit including a first electrode;
at least one first chalcogenide glass layer in contact with said first electrode;
at least one first metal-containing layer in contact with said at least one first chalcogenide glass layer;
at least one first silver layer in contact with said at least one first metal-containing layer;
at least one second chalcogenide glass layer in contact with said at least one first silver layer;
at least one second metal-containing layer in contact with said at least one second chalcogenide glass layer;
at least one second silver layer in contact with said at least one second metal-containing layer;
at least one third chalcogenide glass layer in contact with said at least one second silver layer; and
a second electrode in contact with said at least one third chalcogenide glass layer.

147. The system of claim 146 wherein said metal-containing layers comprise one or more silver-selenide layers.

148. The system of claim 146 wherein one or more of said chalcogenide glass layers comprise a plurality of chalcogenide glass layers.

149. The system of claim 146 wherein one or more of said metal-containing layers comprises a plurality of metal-containing layers.

150. The system of claim 146 wherein one or more of said chalcogenide glass layers contains a metal dopant.

151. The system of claim 150 wherein said metal dopant comprises silver.

152. The system of claim 146 wherein each of said at least one first and second silver layers is an evaporated silver layer.

153. The method of claim 146 wherein each of said at least one first and second silver layers has a thickness of from about 50 Å to about 250 Å.

154. The method of claim 146 further comprising a third silver layer located on a side of said first metal-containing layer opposite the side on which said first silver layer is located, and a fourth silver layer located on a side of said second metal-containing layer opposite the side on which said second silver layer is located.

155. A memory element comprising:
a first electrode;
a second electrode; and
a plurality of chalcogenide glass layers, a plurality of metal-containing layers, and a plurality of silver layers between said first and second electrodes, each of said plurality of metal-containing layers being in contact with at least one of said plurality of silver layers, whereby said plurality of chalcogenide glass layers alternate with said metal-containing layers and said silver layers, with one of said chalcogenide glass layers in contact with said first electrode and another of said chalcogenide glass layers in contact with said second electrode.

156. The memory element of claim 155 wherein said plurality of metal-containing layers comprises one or more silver-selenide layers.

157. The memory element of claim 155 wherein one or more of said plurality of chalcogenide glass layers comprises a plurality of chalcogenide glass layers.

158. The memory element of claim 155 wherein one or more of said plurality of metal-containing layers comprises a plurality of metal-containing layers.

159. The memory element of claim 155 wherein one or more of said plurality of chalcogenide glass layers contains a metal dopant.

160. The memory element of claim 159 wherein said metal dopant comprises silver.

161. The memory element of claim 155 wherein each of said plurality of silver layers is an evaporated silver layer.

162. The memory element of claim 155 wherein each of said plurality of silver layers has a thickness of from about 50 Å to about 250 Å.

163. A method of forming a resistance variable memory element comprising:
forming a first electrode;
forming a second electrode; and
forming a plurality of chalcogenide glass layers, a plurality of metal-containing layers, and a plurality of silver layers between said first and second electrodes, each of said plurality of metal-containing layers being in contact with at least one of said plurality of silver layers, whereby said plurality of chalcogenide glass layers alternate with said metal-containing layers and said silver layers, with one of said chalcogenide glass layers in contact with said first electrode and another of said chalcogenide glass layers in contact with said second electrode.

164. The method of claim 163 wherein said plurality of metal-containing layers comprises one or more silver-selenide layers.

165. The method of claim 163 wherein one or more of said plurality of chalcogenide glass layers comprises a plurality of chalcogenide glass layers.

166. The method of claim 163 wherein one or more of said plurality of metal-containing layers comprises a plurality of metal-containing layers.

167. The method of claim 163 wherein one or more of said plurality of chalcogenide glass layers contains a metal dopant.

168. The method of claim 167 wherein said metal dopant comprises silver.

169. The method of claim 163 wherein each of said plurality of silver layers is an evaporated silver layer.

170. The method of claim 163 wherein each of said plurality of silver layers has a thickness of from about 50 Å to about 250 Å.

* * * * *

UNITED STATES PATENT AND TRADEMARK OFFICE
CERTIFICATE OF CORRECTION

PATENT NO. : 7,061,004 B2
APPLICATION NO. : 10/622482
DATED : June 13, 2006
INVENTOR(S) : Kristy A. Campbell It is certified that error appears in the above-identified patent and that said Letters Patent is hereby corrected as shown below:

On the Title Page, [56] delete Inventors name "Lowery" should read --Lowrey--.

In the U.S. Patent Documents portion of the References Cited section, the following error is corrected for the inventor in the following 15 patents:

| | | | |
|---|---|---|---|
| 6,404,665 | 6,501,111 | 6,511,867 | 6,545,907 |
| 6,555,860 | 6,563,164 | 6,567,293 | 6,570,784 |
| 6,576,921 | 6,586,761 | 6,590,807 | 6,625,054 |
| 6,667,900 | 6,687,153 | 6,707,712 | |

In the Other Publications portion of the References Cited section, the following errors are corrected:

"Kotkata, M.F.; Afif, M.A.; Labib, H.H.; Hegab, N.A.; Abdel-Aziz, M.M., Memory switching in amorphous GeSeTl chalcogenide semiconductor films, Thin Solid Films 240 (1994) 143-146."

should read

--Kotkata, M.F.; Afifi, M.A.; Labib, H.H.; Hegab, N.A.; Abdel-Aziz, M.M., Memory switching in amorphous GeSeTl chalcogenide semiconductor films, Thin Solid Films 240 (1994) 143-146.--;

"McHardy et al., The dissolution of metals in amorphous chalcogenides and the effects o electron and ultraviolet radiation, 20 J. Phys. C.: Solid State Phys., pp. 4055-4075 (1987)f."

should read

--McHardy et al., The dissolution of metals in amorphous chalcogenides and the effects of electron and ultraviolet radiation, 20 J. Phys. C.: Solid State Phys., pp. 4055-4075 (1987).--;

"Titus, S.S.K.; Chatterj e, R.; Asokan, S., Electrical switching and short-range rder in As-T glasses, Phys. Rev. B 48 (1993) 14650-14652."

should read

UNITED STATES PATENT AND TRADEMARK OFFICE
CERTIFICATE OF CORRECTION

PATENT NO.      : 7,061,004 B2
APPLICATION NO. : 10/622482
DATED           : June 13, 2006
INVENTOR(S)     : Kristy A. Campbell It is certified that error appears in the above-identified patent and that said Letters Patent is hereby corrected as shown below:

--Titus, S.S.K.; Chatterjee, R.; Asokan, S., Electrical switching and short-range order in As-Te glasses, Phys. Rev. B 48 (1993) 14650-14652.--; and "Tranchant, S.; Peytavin, S.; Ribes, M.; Flank, A.M.; Dexpert, H.; Lagarde, J.P., Silver chalcogenide glasses Ag-Ge-Se: Ionic conduction and exafs structural investigation, Transport-structure relations in fast ion and mixed conductors Proceedings of the 6th Riso International symposium, Sep. 9-13, 1985."

should read

--Tranchant, S.; Peytavin, S.; Ribes, M.; Flank, A.M.; Dexpert, H.; Lagarde, J.P., Silver chalcogenide glasses Ag-Ge-Se: Ionic conduction and EXAFS structural investigation, Transport-structure relations in fast ion and mixed conductors, Proc. of the 6th RISO Int'l Symp., Sep. 9-13, 1985.--.

Column 10, line 19, "include" should read --includes--;

Column 10, line 47, "via to the" should read --via the--;

Column 10, line 50, "to one additional" should read --to additional--; and

Column 11, line 1, "system" should read --systems--.

Signed and Sealed this

Seventh Day of November, 2006

JON W. DUDAS
*Director of the United States Patent and Trademark Office*